(12) United States Patent
Chaji et al.

(10) Patent No.: US 8,576,217 B2
(45) Date of Patent: Nov. 5, 2013

(54) SYSTEM AND METHODS FOR EXTRACTION OF THRESHOLD AND MOBILITY PARAMETERS IN AMOLED DISPLAYS

(75) Inventors: Gholamreza Chaji, Waterloo (CA); Yaser Azizi, Waterloo (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 201 days.

(21) Appl. No.: 13/112,468

(22) Filed: May 20, 2011

(65) Prior Publication Data
US 2012/0293478 A1 Nov. 22, 2012

(51) Int. Cl.
*G06F 3/038* (2013.01)
*G09G 5/00* (2006.01)

(52) U.S. Cl.
USPC .......................................................... 345/212

(58) Field of Classification Search
None
See application file for complete search history.

(56) References Cited

U.S. PATENT DOCUMENTS

| | | | |
|---|---|---|---|
| 4,354,162 A | 10/1982 | Wright | |
| 5,589,847 A | 12/1996 | Lewis | |
| 5,670,973 A | 9/1997 | Bassetti et al. | |
| 5,748,160 A | 5/1998 | Shieh et al. | |
| 5,815,303 A | 9/1998 | Berlin | |
| 6,097,360 A | 8/2000 | Holloman | |
| 6,259,424 B1 | 7/2001 | Kurogane | |
| 6,288,696 B1 | 9/2001 | Holloman | |
| 6,320,325 B1 | 11/2001 | Cok et al. | |
| 6,414,661 B1 | 7/2002 | Shen et al. | |
| 6,580,657 B2 | 6/2003 | Sanford et al. | |
| 6,594,606 B2 | 7/2003 | Everitt | |
| 6,618,030 B2 | 9/2003 | Kane et al. | |
| 6,687,266 B1 | 2/2004 | Ma et al. | |
| 6,690,344 B1 | 2/2004 | Takeuchi et al. | |
| 6,693,388 B2 | 2/2004 | Oomura | |
| 6,720,942 B2 | 4/2004 | Lee et al. | |
| 6,738,035 B1 | 5/2004 | Fan | |
| 6,771,028 B1 | 8/2004 | Winters | |
| 6,777,712 B2 | 8/2004 | Sanford et al. | |
| 6,806,638 B2 | 10/2004 | Lin et al. | |
| 6,809,706 B2 | 10/2004 | Shimoda | |

(Continued)

FOREIGN PATENT DOCUMENTS

| | | |
|---|---|---|
| CA | 1294034 | 1/1992 |
| CA | 2368386 | 9/1999 |

(Continued)

OTHER PUBLICATIONS

International Search Report, PCT/IB2012/052372, mailed Sep. 12, 2012 (3 pages).

(Continued)

*Primary Examiner* — Nicholas Lee
(74) *Attorney, Agent, or Firm* — Nixon Peabody LLP

(57) ABSTRACT

Disclosed is a system and method to improve the extraction of transistor and OLED parameters in an AMOLED display for compensation of programming voltages to improve image quality. A pixel circuit includes an organic light emitting device, a drive device to provide a programmable drive current to the light emitting device, a programming input to provide the programming signal, and a storage device to store the programming signal. A charge-pump amplifier has a current input and a voltage output. The charge-pump amplifier includes an operational amplifier in negative feedback configuration. The feedback is provided by a capacitor connected between the output and the inverting input of the operational amplifier. A common-mode voltage source drives the non-inverting input of the operational amplifier. An electronic switch is coupled across the capacitor to reset the capacitor.

14 Claims, 12 Drawing Sheets

(56) References Cited

U.S. PATENT DOCUMENTS

| | | | |
|---|---|---|---|
| 6,909,419 | B2 | 6/2005 | Zavracky et al. |
| 6,937,215 | B2 | 8/2005 | Lo |
| 6,943,500 | B2 | 9/2005 | LeChevalier |
| 6,995,510 | B2 | 2/2006 | Murakami et al. |
| 6,995,519 | B2 | 2/2006 | Arnold et al. |
| 7,027,015 | B2 | 4/2006 | Booth, Jr. et al. |
| 7,034,793 | B2 | 4/2006 | Sekiya et al. |
| 7,106,285 | B2 | 9/2006 | Naugler |
| 7,274,363 | B2 | 9/2007 | Ishizuka et al. |
| 7,321,348 | B2 | 1/2008 | Cok et al. |
| 7,423,617 | B2 | 9/2008 | Giraldo et al. |
| 7,502,000 | B2 | 3/2009 | Yuki et al. |
| 7,535,449 | B2 | 5/2009 | Miyazawa |
| 7,554,512 | B2 | 6/2009 | Steer |
| 7,619,594 | B2 | 11/2009 | Hu |
| 7,619,597 | B2 | 11/2009 | Nathan et al. |
| 2002/0084463 | A1 | 7/2002 | Sanford et al. |
| 2002/0101172 | A1 | 8/2002 | Bu |
| 2002/0158823 | A1 | 10/2002 | Zavracky et al. |
| 2002/0186214 | A1 | 12/2002 | Siwinski |
| 2002/0190971 | A1 | 12/2002 | Nakamura et al. |
| 2002/0195967 | A1 | 12/2002 | Kim et al. |
| 2003/0020413 | A1 | 1/2003 | Oomura |
| 2003/0030603 | A1 | 2/2003 | Shimoda |
| 2003/0076048 | A1 | 4/2003 | Rutherford |
| 2003/0151569 | A1 | 8/2003 | Lee et al. |
| 2003/0179626 | A1 | 9/2003 | Sanfod et al. |
| 2004/0066357 | A1 | 4/2004 | Kawasaki |
| 2004/0135749 | A1 | 7/2004 | Kondakov et al. |
| 2004/0183759 | A1 | 9/2004 | Stevenson et al. |
| 2004/0189627 | A1 | 9/2004 | Shirasaki et al. |
| 2004/0257355 | A1 | 12/2004 | Naugler |
| 2005/0017650 | A1 | 1/2005 | Fryer et al. |
| 2005/0110420 | A1 | 5/2005 | Arnold et al. |
| 2005/0140610 | A1 | 6/2005 | Smith et al. |
| 2005/0145891 | A1 | 7/2005 | Abe |
| 2005/0156831 | A1 | 7/2005 | Yamazaki et al. |
| 2006/0038758 | A1 | 2/2006 | Routley et al. |
| 2006/0232522 | A1 | 10/2006 | Roy et al. |
| 2007/0080908 | A1 | 4/2007 | Nathan et al. |
| 2007/0182671 | A1 | 8/2007 | Nathan et al. |
| 2008/0048951 | A1 | 2/2008 | Naugler, Jr. et al. |
| 2008/0117144 | A1 | 5/2008 | Nakano et al. |
| 2012/0056558 | A1 | 3/2012 | Toshiya et al. |

FOREIGN PATENT DOCUMENTS

| | | |
|---|---|---|
| CA | 2432530 | 7/2002 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CN | 1760945 | 4/2006 |
| EP | 1 194 013 | 3/2002 |
| EP | 1 335 430 A1 | 8/2003 |
| EP | 1 381 019 | 1/2004 |
| EP | 1 521 203 A2 | 4/2005 |
| JP | 10-254410 | 9/1998 |
| JP | 2002-278513 | 9/2002 |
| JP | 2003-076331 | 3/2003 |
| JP | 2003-308046 | 10/2003 |
| TW | 473622 | 1/2002 |
| TW | 1221268 | 9/2004 |
| TW | 1223092 | 11/2004 |
| WO | 99/48079 | 9/1999 |
| WO | 01/27910 A1 | 4/2001 |
| WO | 03/034389 | 4/2003 |
| WO | 03/063124 | 7/2003 |
| WO | 2004/003877 | 1/2004 |
| WO | 2004/034364 | 4/2004 |
| WO | 2005/022498 | 3/2005 |
| WO | 2005/055185 | 6/2005 |
| WO | 2006/063448 | 6/2006 |

OTHER PUBLICATIONS

International Written Opinion, PCT/IB2012/052372, mailed Sep. 12, 2012 (6 pages).

Ahnood et al.: "Effect of threshold voltage instability on field effect mobility in thin film transistors deduced from constant current measurements"; dated Aug. 2009.

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Arokia Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

Chaji et al.: "A Novel Driving Scheme and Pixel Circuit for AMOLED Displays"; dated Jun. 2006 (4 pages).

Chaji et al.: "A novel driving scheme for high-resolution large-area a-Si:H AMOLED displays"; dated Aug. 2005 (4 pages).

Chaji et al.: "A Stable Voltage-Programmed Pixel Circuit for a-Si:H AMOLED Displays"; dated Dec. 2006 (12 pages).

Chaji et al.: "A Sub-µA fast-settling current-programmed pixel circuit for AMOLED displays"; dated Sep. 2007.

Chaji et al.: "An Enhanced and Simplified Optical Feedback Pixel Circuit for AMOLED Displays"; dated Oct. 2006.

Chaji et al.: "Compensation technique for DC and transient instability of thin film transistor circuits for large-area devices"; dated Aug. 2008.

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "Electrical Compensation of OLED Luminance Degradation"; dated Dec. 2007 (3 pages).

Chaji et al.: "eUTDSP: a design study of a new VLIW-based DSP architecture"; dated May 2003 (4 pages).

Chaji et al.: "Fast and Offset-Leakage Insensitive Current-Mode Line Driver for Active Matrix Displays and Sensors"; dated Feb. 2009 (8 pages).

Chaji et al.: "High Speed Low Power Adder Design With A New Logic Style: Pseudo Dynamic Logic (SDL)"; dated Oct. 2001 (4 pages).

Chaji et al.: "High-precision, fast current source for large-area current-programmed a-Si flat panels"; dated Sep. 2006 (4 pages).

Chaji et al.: "Low-Cost AMOLED Television with IGNIS Compensating Technology"; dated May 2008 (4 pages).

Chaji et al.: "Low-Cost Stable a-Si:H AMOLED Display for Portable Applications"; dated Jun. 2006 (4 pages).

Chaji et al.: "Low-Power Low-Cost Voltage-Programmed a-Si:H AMOLED Display"; dated Jun. 2008 (5 pages).

Chaji et al.: "Merged phototransistor pixel with enhanced near infra-red response and flicker noise reduction for biomolecular imaging"; dated Nov. 2008 (3 pages).

Chaji et al.: "Parallel Addressing Scheme for Voltage-Programmed Active-Matrix OLED Displays"; dated May 2007 (6 pages).

Chaji et al.: "Pseudo dynamic logic (SDL): a high-speed and low-power dynamic logic family"; dated 2002 (4 pages).

(56) References Cited

OTHER PUBLICATIONS

Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
Jafarabadiashtiani et al.: "A New Driving Method for a-Si AMOLED Displays Based on Voltage Feedback"; dated 2005 (4 pages).
Joon-Chul Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
Lee et al.: "Ambipolar Thin-Film Transistors Fabricated by PECVD Nanocrystalline Silicon"; dated 2006 (6 pages).
Ma E Y et al.: "Organic light emitting diode/thin film transistor integration for foldable displays" dated Sep. 15, 1997(4 pages).
Matsueda y et al.: "35.1: 2.5-in. AMOLED with Integrated 6-bit Gamma Compensated Digital Data Driver"; dated May 2004.
Nathan A. et al., "Thin Film imaging technology on glass and plastic" ICM 2000, proceedings of the 12 international conference on microelectronics, dated Oct. 31, 2001 (4 pages).
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Stewart M. et al., "Polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

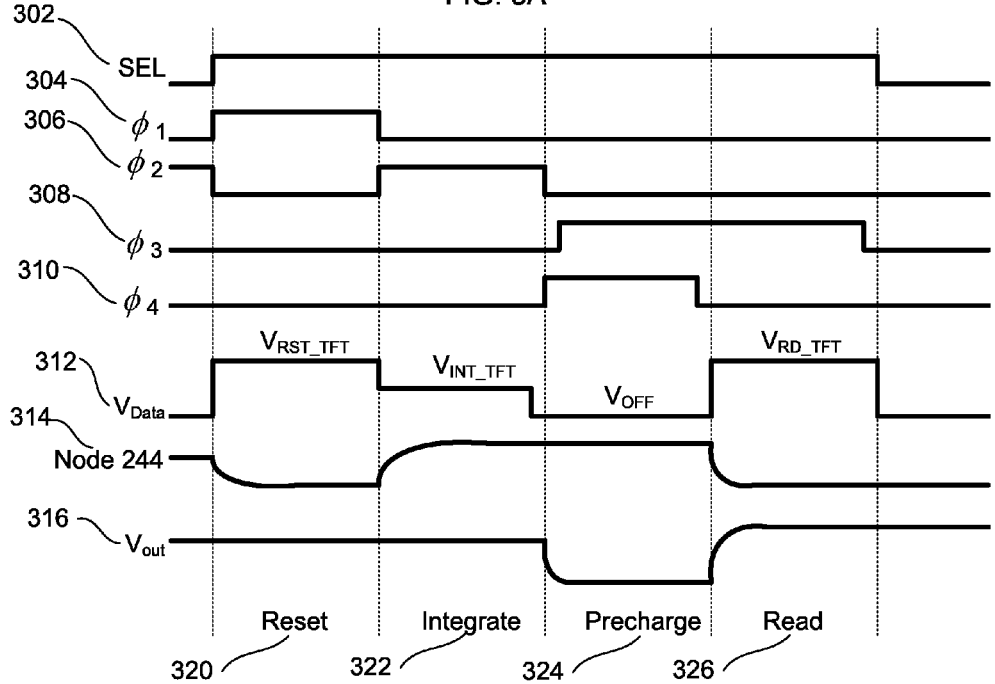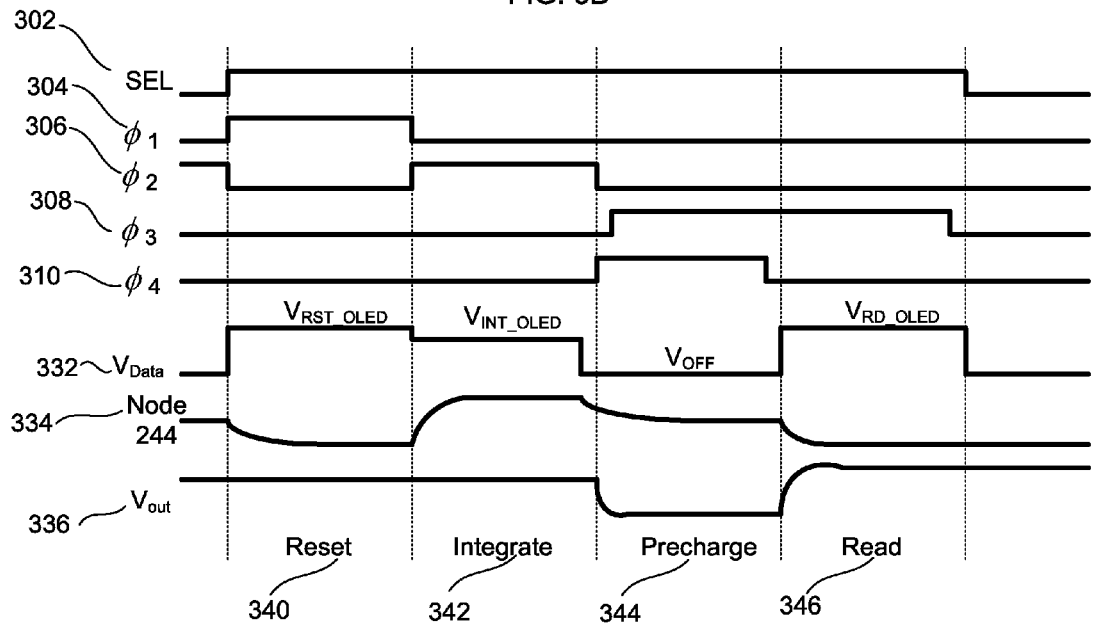

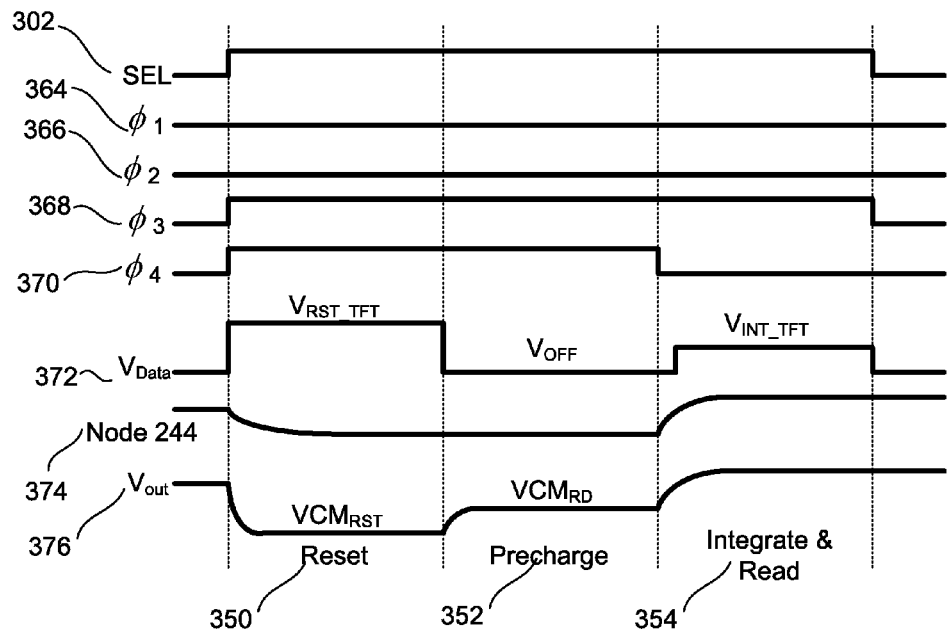
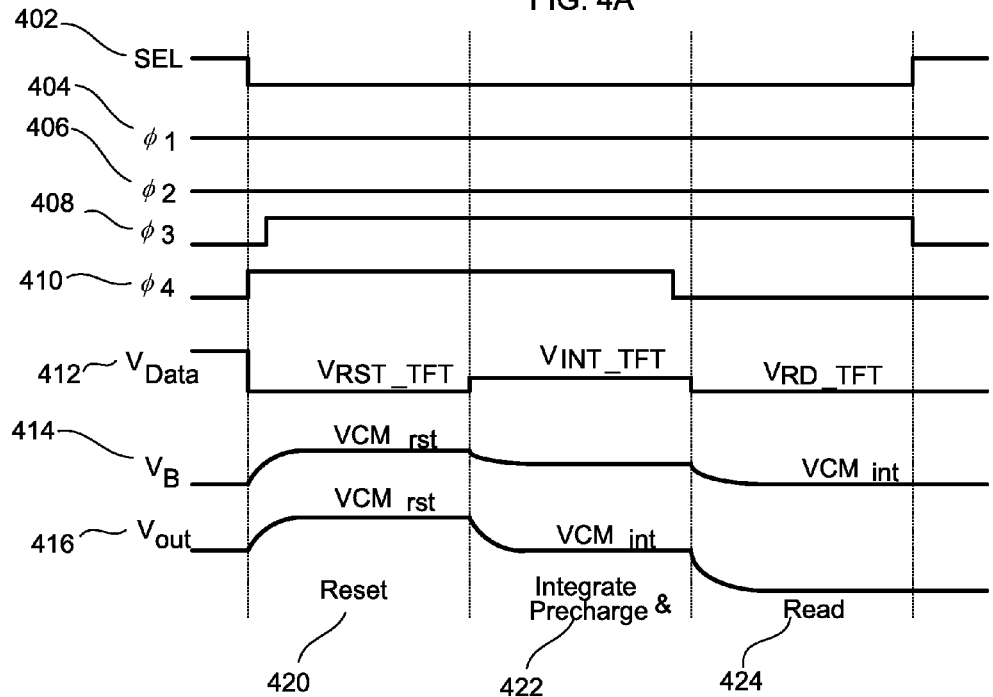

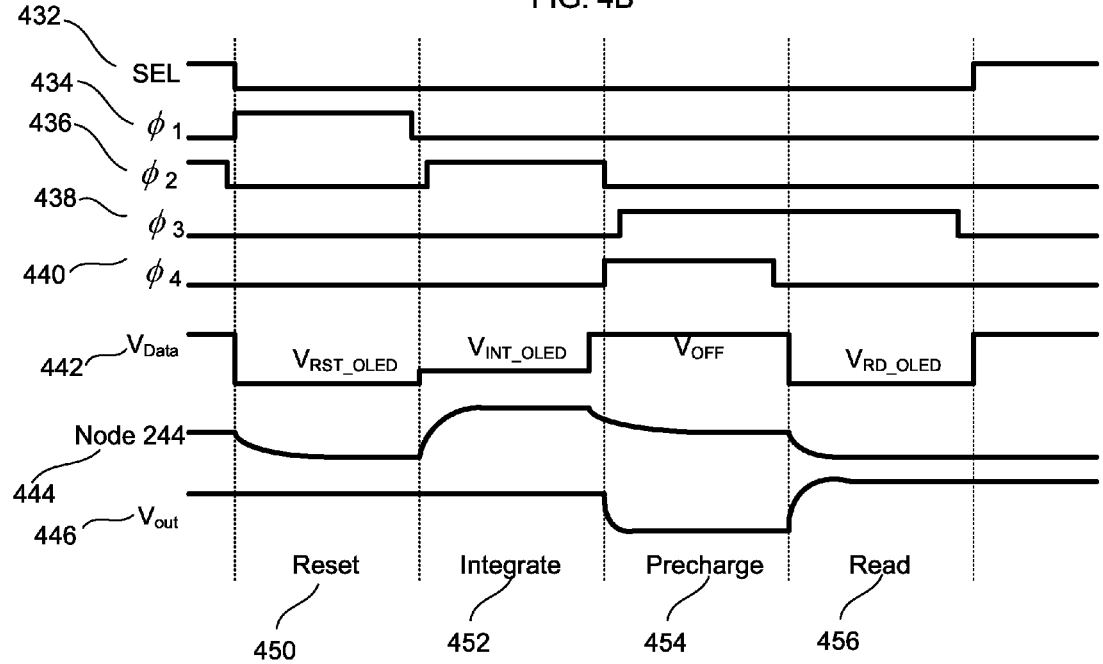
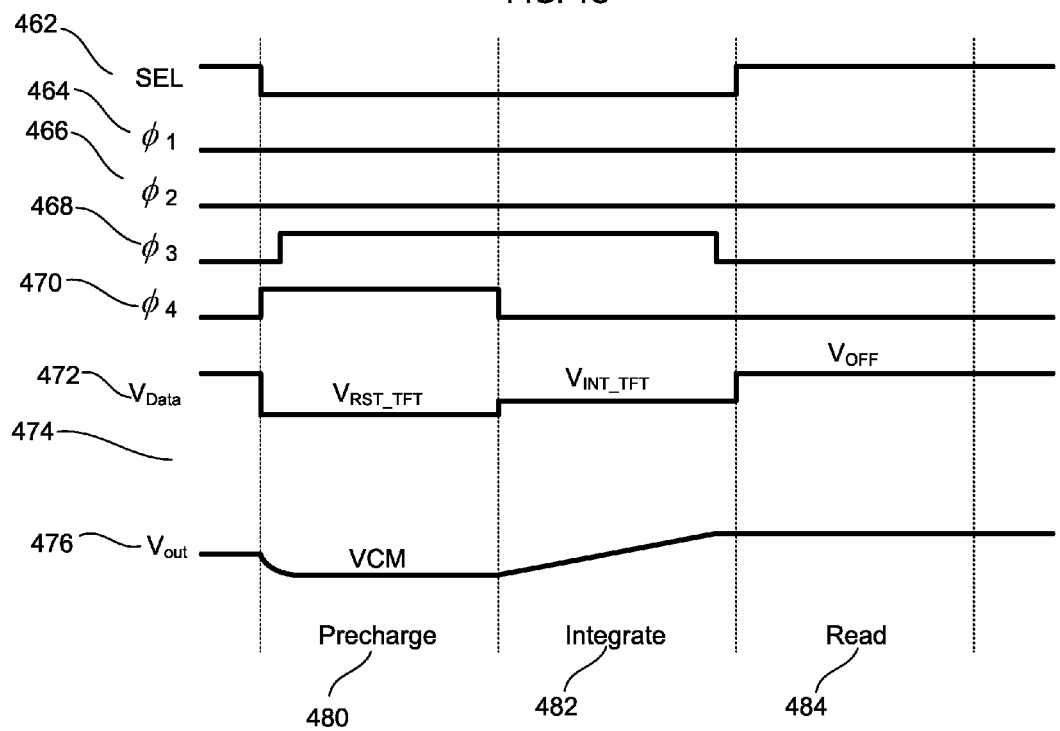

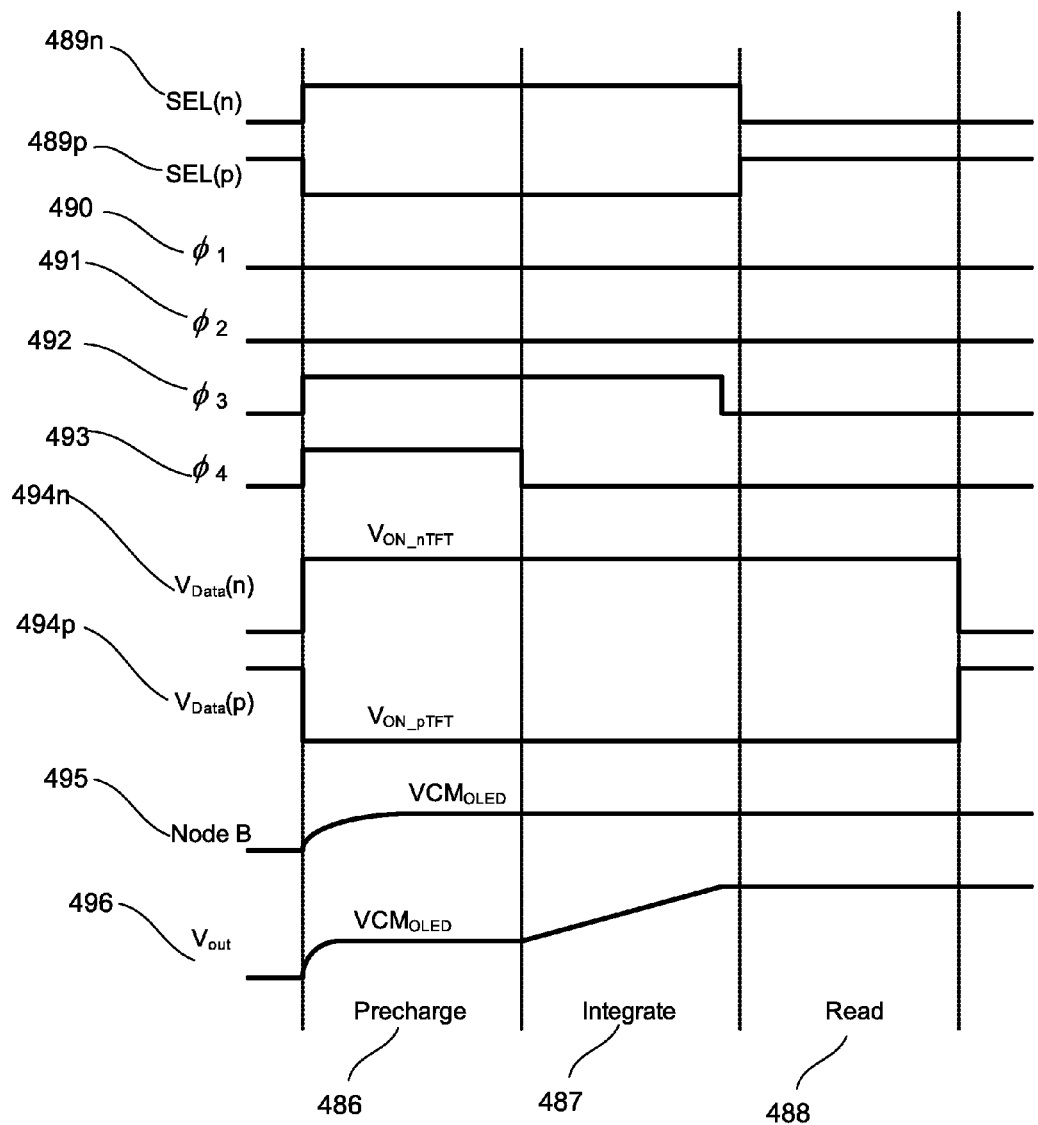

US 8,576,217 B2

SYSTEM AND METHODS FOR EXTRACTION OF THRESHOLD AND MOBILITY PARAMETERS IN AMOLED DISPLAYS

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention generally relates to active matrix organic light emitting device (AMOLED) displays, and particularly extracting threshold and mobility factors from the pixel drivers for such displays.

BACKGROUND

Currently, active matrix organic light emitting device ("AMOLED") displays are being introduced. The advantages of such displays include lower power consumption, manufacturing flexibility and faster refresh rate over conventional liquid crystal displays. In contrast to conventional liquid crystal displays, there is no backlighting in an AMOLED display, and thus each pixel consists of different colored OLEDs emitting light independently. The OLEDs emit light based on current supplied through a drive transistor controlled by a programming voltage. The power consumed in each pixel has a relation with the magnitude of the generated light in that pixel.

The quality of output in an OLED based pixel is affected by the properties of the drive transistor, which is typically fabricated from materials including but not limited to amorphous silicon, polysilicon, or metal oxide, as well as the OLED itself. In particular, threshold voltage and mobility of the drive transistor tend to change as the pixel ages. In order to maintain image quality, changes in these parameters must be compensated for by adjusting the programming voltage. In order to do so, such parameters must be extracted from the driver circuit. The addition of components to extract such parameters in a simple driver circuit requires more space on a display substrate for the drive circuitry and thereby reduces the amount of aperture or area of light emission from the OLED.

When biased in saturation, the I-V characteristic of a thin film drive transistor depends on mobility and threshold voltage which are a function of the materials used to fabricate the transistor. Thus different thin film transistor devices implemented across the display panel may demonstrate non-uniform behavior due to aging and process variations in mobility and threshold voltage. Accordingly, for a constant voltage, each device may have a different drain current. An extreme example may be where one device could have low threshold-voltage and low mobility compared to a second device with high threshold-voltage and high mobility.

Thus with very few electronic components available to maintain a desired aperture, extraction of non-uniformity parameters (i.e. threshold voltage, $V_{th}$, and mobility, $\mu$) of the drive TFT and the OLED becomes challenging. It would be desirable to extract such parameters in a driver circuit for an OLED pixel with as few components as possible to maximize pixel aperture.

SUMMARY

One example disclosed is a data extraction system for an organic light emitting device (OLED) based display. The system includes a pixel circuit including an organic light emitting device, a drive device to provide a programmable drive current to the light emitting device, a programming input to provide a programming signal, and a storage device to store the programming signal. A charge-pump amplifier has a current input and a voltage output. The charge-pump amplifier includes an operational amplifier in negative feedback configuration. The feedback is provided by a capacitor connected between the output and the inverting input of the operational amplifier. A common-mode voltage source drives the non-inverting input of the operational amplifier. An electronic switch is coupled across the capacitor to reset the capacitor. A switch module including the input is coupled to the output of the pixel circuit and an output is coupled to the input of the charge-pump amplifier. The switch module includes a plurality of electronic switches that may be controlled by external control signals to steer current in and out of the pixel circuit, provide a discharge path between the pixel circuit and the charge-pump amplifier and isolate the charge-pump amplifier from the pixel circuit. A controller is coupled to the pixel circuit, charge-pump amplifier and the switch module. The controller controls input signals to the pixel circuit, charge-pump amplifier and switch module in a predetermined sequence to produce an output voltage value which is a function of a parameter of the pixel circuit. The sequence includes providing a program voltage to the programming input to either pre-charge an internal capacitance of the pixel circuit to a charge level and transfer the charge to the charge-pump amplifier via the switch module to generate the output voltage value or provide a current from the pixel circuit to the charge-pump amplifier via the switch module to produce the output voltage value by integration over a certain period of time.

Another example is a method of extracting a circuit parameter from a pixel circuit including an organic light emitting device, a drive device to provide a programmable drive current to the light emitting device, a programming input, and a storage device to store a programming signal. A predetermined program voltage is provided to the programming voltage input. A capacitance of the pixel circuit is charged to a charge level or a current from the pixel circuit. The pixel circuit is coupled to a charge-pump amplifier. The charge-pump amplifier is isolated from the pixel circuit to provide a voltage output either proportional to the charge level or to integrate the current from the pixel circuit. The voltage output of the charge-pump amplifier is read. At least one pixel circuit parameter is determined from the voltage output of the charge-pump amplifier.

Another example is a data extraction system for an organic light emitting device (OLED) based display. The system includes a pixel circuit having a drive transistor, an organic light emitting device, and a programming input coupled to the gate of the drive transistor. The drive transistor has a source or a drain coupled to the OLED. A charge-pump amplifier has an input and an integrated voltage output. A switch module includes an input coupled to the output of the pixel circuit and an output coupled to the input of the charge-pump amplifier. The switch module includes switches to steer current in and out of the pixel circuit, provide a discharge path between the pixel circuit and the charge-pump amplifier and isolate the charge-pump amplifier from the pixel circuit. A controller is coupled to the pixel circuit, charge-pump amplifier and the switch module. The controller controls voltage inputs to the pixel circuit, charge-pump amplifier and switch module in a predetermined sequence to produce an output voltage value which is a function of a parameter of the pixel circuit. The sequence including providing a program voltage to the programming input to either pre-charge a capacitance of the pixel circuit to a charge level, transfer the charge to the charge-pump amplifier via the switch module to generate the output voltage value or provide a current from the pixel circuit to the charge-pump amplifier via the switch module to produce the output voltage value by integration.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 3A is a signal timing diagram of the signals to the data extraction circuit to extract the threshold voltage and mobility of an n-type drive transistor in FIG. 2;

FIG. 3B is a signal timing diagram of the signals to the data extraction circuit to extract the characteristic voltage of the OLED in FIG. 2 with an n-type drive transistor;

FIG. 3C is a signal timing diagram of the signals to the data extraction circuit for a direct read to extract the threshold voltage of an n-type drive transistor in FIG. 2;

FIG. 4A is a signal timing diagram of the signals to the data extraction circuit to extract the threshold voltage and mobility of a p-type drive transistor in FIG. 2;

FIG. 4B is a signal timing diagram of the signals to the data extraction circuit to extract the characteristic voltage of the OLED in FIG. 2 with a p-type drive transistor;

FIG. 4C is a signal timing diagram of the signals to the data extraction circuit for a direct read to extract the threshold voltage of a p-type drive transistor in FIG. 2;

FIG. 4D is a signal timing diagram of the signals to the data extraction circuit for a direct read of the OLED turn-on voltage using either an n-type or p-type drive transistor in FIG. 2.

Figure 1:
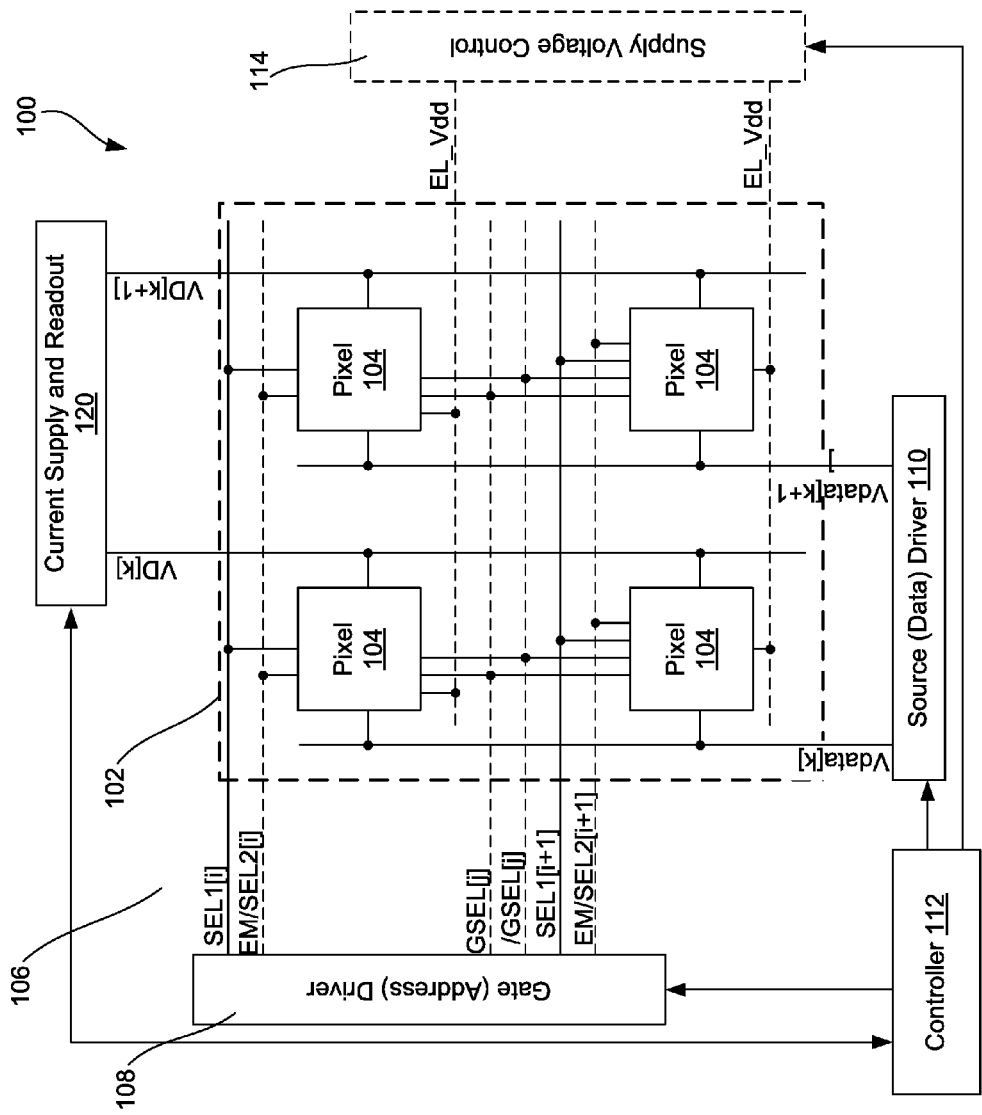
FIG. 1 is a block diagram of an AMOLED display with compensation control.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 is an electronic display system 100 having an active matrix area or pixel array 102 in which an n×m array of pixels 104 are arranged in a row and column configuration. For ease of illustration, only two rows and two columns are shown. External to the active matrix area of the pixel array 102 is a peripheral area 106 where peripheral circuitry for driving and controlling the pixel array 102 are disposed. The peripheral circuitry includes an address or gate driver circuit 108, a data or source driver circuit 110, a controller 112, and an optional supply voltage (e.g., Vdd) driver 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. In pixel sharing configurations described below, the gate or address driver circuit 108 can also optionally operate on global select lines GSEL[j] and optionally/GSEL[j], which operate on multiple rows of pixels 104 in the pixel array 102, such as every two rows of pixels 104. The source driver circuit 110, under control of the controller 112, operates on voltage data lines Vdata[k], Vdata[k+1], and so forth, one for each column of pixels 104 in the pixel array 102. The voltage data lines carry voltage programming information to each pixel 104 indicative of the brightness of each light emitting device in the pixel 104. A storage element, such as a capacitor, in each pixel 104 stores the voltage programming information until an emission or driving cycle turns on the light emitting device. The optional supply voltage driver 114, under control of the controller 112, controls a supply voltage (EL_Vdd) line, one for each row or column of pixels 104 in the pixel array 102.

The display system 100 further includes a current supply and readout circuit 120, which reads output data from data output lines, VD [k], VD [k+1], and so forth, one for each column of pixels 104 in the pixel array 102.

As is known, each pixel 104 in the display system 100 needs to be programmed with information indicating the brightness of the light emitting device in the pixel 104. A frame defines the time period that includes: (i) a programming cycle or phase during which each and every pixel in the display system 100 is programmed with a programming voltage indicative of a brightness; and (ii) a driving or emission cycle or phase during which each light emitting device in each pixel is turned on to emit light at a brightness commensurate with the programming voltage stored in a storage element. A frame is thus one of many still images that compose a complete moving picture displayed on the display system 100. There are at least schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all rows of pixels are driven at once. Either scheme can employ a brief vertical blanking time at the beginning or end of each frame during which the pixels are neither programmed nor driven.

The components located outside of the pixel array 102 may be disposed in a peripheral area 106 around the pixel array 102 on the same physical substrate on which the pixel array 102 is disposed. These components include the gate driver 108, the source driver 110, the optional supply voltage driver 114, and a current supply and readout circuit 120. Alternately, some of the components in the peripheral area 106 may be disposed on the same substrate as the pixel array 102 while other components are disposed on a different substrate, or all of the components in the peripheral area can be disposed on a substrate different from the substrate on which the pixel array 102 is disposed. Together, the gate driver 108, the source driver 110, and the supply voltage driver 114 make up a display driver circuit. The display driver circuit in some configurations can include the gate driver 108 and the source driver 110 but not the supply voltage control 114.

When biased in saturation, the first order I-V characteristic of a metal oxide semiconductor (MOS) transistor (a thin film transistor in this case of interest) is modeled as:

$$I_D = \frac{1}{2}\mu C_{ox} \frac{W}{L}(V_{GS} - V_{th})^2$$

where $I_D$ is the drain current and $V_{GS}$ is the voltage difference applied between gate and source terminals of the transistor. The thin film transistor devices implemented across the display system 100 demonstrate non-uniform behavior due to aging and process variations in mobility ($\mu$) and threshold voltage ($V_{th}$). Accordingly, for a constant voltage difference applied between gate and source, $V_{GS}$, each transistor on the pixel matrix 102 may have a different drain current based on a non-deterministic mobility and threshold voltage:

$$I_{D(i,j)} = f(\mu_{i,j}, V_{th\,i,j})$$

where i and j are the coordinates (row and column) of a pixel in an n×m array of pixels such as the array of pixels 102 in FIG. 1.

Figure 2:
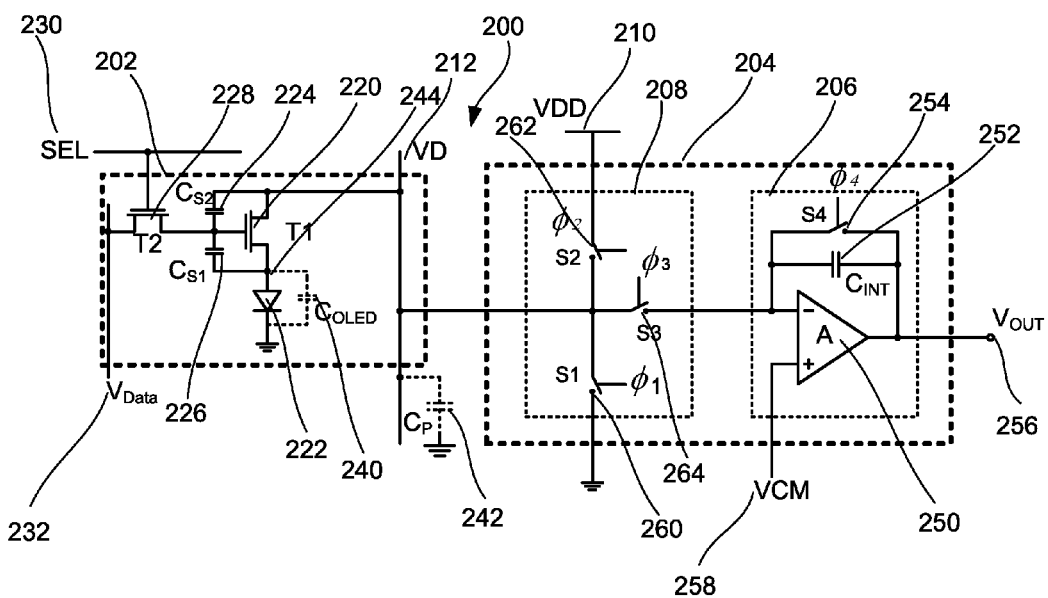
FIG. 2 is a circuit diagram of a data extraction circuit for a two-transistor pixel in the AMOLED display in FIG. 1.

FIG. 2 shows a data extraction system 200 including a two-transistor (2T) driver circuit 202 and a readout circuit 204. The supply voltage control 114 is optional in a display system with 2T pixel circuit 104. The readout circuit 204 is part of the current supply and readout circuit 120 and gathers data from a column of pixels 104 as shown in FIG. 1. The readout circuit 204 includes a charge pump circuit 206 and a switch-box circuit 208. A voltage source 210 provides the supply voltage to the driver circuit 202 through the switch-box circuit 208. The charge-pump and switch-box circuits 206 and 208 are implemented on the top or bottom side of the array 102 such as in the voltage drive 114 and the current supply and readout circuit 120 in FIG. 1. This is achieved by either direct fabrication on the same substrate as the pixel array 102 or by bonding a microchip on the substrate or a flex as a hybrid solution.

The driver circuit 202 includes a drive transistor 220, an organic light emitting device 222, a drain storage capacitor 224, a source storage capacitor 226, and a select transistor 228. A supply line 212 provides the supply voltage and also a monitor path (for the readout circuit 204) to a column of driver circuits such as the driver circuit 202. A select line input 230 is coupled to the gate of the select transistor 228. A programming data input 232 is coupled to the gate of the drive transistor 220 through the select transistor 228. The drain of the drive transistor 220 is coupled to the supply voltage line 212 and the source of the drive transistor 220 is coupled to the OLED 222. The select transistor 228 controls the coupling of the programming input 230 to the gate of the drive transistor 220. The source storage capacitor 226 is coupled between the gate and the source of the drive transistor 220. The drain storage capacitor 224 is coupled between the gate and the drain of the drive transistor 220. The OLED 222 has a parasitic capacitance that is modeled as a capacitor 240. The supply voltage line 212 also has a parasitic capacitance that is modeled as a capacitor 242. The drive transistor 220 in this example is a thin film transistor that is fabricated from amorphous silicon. Of course other materials such as polysilicon or metal oxide may be used. A node 244 is the circuit node where the source of the drive transistor 220 and the anode of the OLED 222 are coupled together. In this example, the drive transistor 220 is an n-type transistor. The system 200 may be used with a p-type drive transistor in place of the n-type drive transistor 220 as will be explained below.

The readout circuit 204 includes the charge-pump circuit 206 and the switch-box circuit 208. The charge-pump circuit 206 includes an amplifier 250 having a positive and negative input. The negative input of the amplifier 250 is coupled to a capacitor 252 ($C_{int}$) in parallel with a switch 254 in a negative feedback loop to an output 256 of the amplifier 250. The switch 254 (S4) is utilized to discharge the capacitor 252 $C_{int}$ during the pre-charge phase. The positive input of the amplifier 250 is coupled to a common mode voltage input 258 (VCM). The output 256 of the amplifier 250 is indicative of various extracted parameters of the drive transistor 220 and OLED 222 as will be explained below.

The switch-box circuit 208 includes several switches 260, 262 and 264 (S1, S2 and S3) to steer current to and from the pixel driver circuit 202. The switch 260 (S1) is used during the reset phase to provide a discharge path to ground. The switch 262 (S2) provides the supply connection during normal operation of the pixel 104 and also during the integration phase of readout. The switch 264 (S3) is used to isolate the charge-pump circuit 206 from the supply line voltage 212 (VD).

The general readout concept for the two transistor pixel driver circuit 202 for each of the pixels 104, as shown in FIG. 2, comes from the fact that the charge stored on the parasitic capacitance represented by the capacitor 240 across the OLED 222 has useful information of the threshold voltage and mobility of the drive transistor 220 and the turn-on voltage of the OLED 222. The extraction of such parameters may be used for various applications. For example, such parameters may be used to modify the programming data for the pixels 104 to compensate for pixel variations and maintain image quality. Such parameters may also be used to pre-age the pixel array 102. The parameters may also be used to evaluate the process yield for the fabrication of the pixel array 102.

Assuming that the capacitor 240 ($C_{OLED}$) is initially discharged, it takes some time for the capacitor 240 ($C_{OLED}$) to charge up to a voltage level that turns the drive transistor 220 off. This voltage level is a function of the threshold voltage of the drive transistor 220. The voltage applied to the programming data input 232 ($V_{Data}$) must be low enough such that the settled voltage of the OLED 222 ($V_{OLED}$) is less than the turn-on threshold voltage of the OLED 222 itself. In this condition, $V_{Data} - V_{OLED}$ is a linear function of the threshold voltage ($V_{th}$) of the drive transistor 220. In order to extract the mobility of a thin film transistor device such as the drive transistor 220, the transient settling of such devices, which is a function of both the threshold voltage and mobility, is considered. Assuming that the threshold voltage deviation among the TFT devices such as the drive transistor 220 is compensated, the voltage of the node 244 sampled at a constant interval after the beginning of integration is a function of mobility only of the TFT device such as the drive transistor 220 of interest.

FIG. 3A-3C are signal timing diagrams of the control signals applied to the components in FIG. 2 to extract parameters such as voltage threshold and mobility from the drive transistor 220 and the turn on voltage of the OLED 222 in the drive circuit 200 assuming the drive transistor 220 is an n-type transistor. Such control signals could be applied by the controller 112 to the source driver 110, the gate driver 108 and the current supply and readout circuit 120 in FIG. 1. FIG. 3A is a timing diagram showing the signals applied to the extraction circuit 200 to extract the threshold voltage and mobility from the drive transistor 220. FIG. 3A includes a signal 302 for the select input 230 in FIG. 2, a signal 304 ($\phi_1$) to the switch 260, a signal 306 ($\phi_2$) for the switch 262, a signal 308 ($\phi_3$) for the switch 264, a signal 310 ($\phi_4$) for the switch 254, a programming voltage signal 312 for the programming data input 232 in FIG. 2, a voltage 314 of the node 244 in FIG. 2 and an output voltage signal 316 for the output 256 of the amplifier 250 in FIG. 2.

FIG. 3A shows the four phases of the readout process, a reset phase 320, an integration phase 322, a pre-charge phase 324 and a read phase 326. The process starts by activating a high select signal 302 to the select input 230. The select signal 302 will be kept high throughout the readout process as shown in FIG. 3A.

During the reset phase 320, the input signal 304 ($\phi_1$) to the switch 260 is set high in order to provide a discharge path to ground. The signals 306, 308 and 310 ($\phi_2$, $\phi_3$, $\phi_4$) to the switches 262, 264 and 250 are kept low in this phase. A high enough voltage level ($V_{RST\_TFT}$) is applied to the programming data input 232 ($V_{Data}$) to maximize the current flow through the drive transistor 220. Consequently, the voltage at the node 244 in FIG. 2 is discharged to ground to get ready for the next cycle.

During the integration phase 322, the signal 304 ($\phi_2$) to the switch 262 stays high which provides a charging path from the voltage source 210 through the switch 262. The signals 304, 308 and 310 ($\phi_1$, $\phi_3$, $\phi_4$) to the switches 260, 264 and 250 are kept low in this phase. The programming voltage input 232 ($V_{Data}$) is set to a voltage level ($V_{INT\_TFT}$) such that once the capacitor 240 ($C_{oled}$) is fully charged, the voltage at the node 244 is less than the turn-on voltage of the OLED 222. This condition will minimize any interference from the OLED 222 during the reading of the drive transistor 220. Right before the end of integration time, the signal 312 to the programming voltage input 232 ($V_{Data}$) is lowered to $V_{OFF}$ in order to isolate the charge on the capacitor 240 ($C_{oled}$) from the rest of the circuit.

When the integration time is long enough, the charge stored on capacitor 240 ($C_{oled}$) will be a function of the threshold voltage of the drive transistor 220. For a shortened integration time, the voltage at the node 244 will experience an incomplete settling and the stored charge on the capacitor 240 ($C_{oled}$) will be a function of both the threshold voltage and mobility of the drive transistor 220. Accordingly, it is feasible to extract both parameters by taking two separate readings with short and long integration phases.

During the pre-charge phase 324, the signals 304 and 306 ($\phi_1$, $\phi_2$) to switches 260 and 262 are set low. Once the input signal 310 ($\phi_4$) to the switch 254 is set high, the amplifier 250 is set in a unity feedback configuration. In order to protect the output stage of the amplifier 250 against short-circuit current from the supply voltage 210, the signal 308 ($\phi_3$) to the switch 264 goes high when the signal 306 ($\phi_2$) to the switch 262 is set low. When the switch 264 is closed, the parasitic capacitance 242 of the supply line is precharged to the common mode voltage, VCM. The common mode voltage, VCM, is a voltage level which must be lower than the ON voltage of the OLED 222. Right before the end of pre-charge phase, the signal 310 ($\phi_4$) to the switch 254 is set low to prepare the charge pump amplifier 250 for the read cycle.

During the read phase 336, the signals 304, 306 and 310 ($\phi_1$, $\phi_2$, $\phi_4$) to the switches 260, 262 and 254 are set low. The signal 308 ($\phi_3$) to the switch 264 is kept high to provide a charge transfer path from the drive circuit 202 to the charge-pump amplifier 250. A high enough voltage 312 ($V_{RD\_TFT}$) is applied to the programming voltage input 232 ($V_{Data}$) to minimize the channel resistance of the drive transistor 220. If the integration cycle is long enough, the accumulated charge on the capacitor 252 ($C_{int}$) is not a function of integration time. Accordingly, the output voltage of the charge-pump amplifier 250 in this case is equal to:

$$V_{out} = -\frac{C_{oled}}{C_{int}}(V_{Data} - V_{th})$$

For a shortened integration time, the accumulated charge on the capacitor 252 ($C_{int}$) is given by:

$$Q_{int} = \int^{T_{int}} i_D(V_{GS}, V_{th}, \mu) \cdot dt$$

Consequently, the output voltage 256 of the charge-pump amplifier 250 at the end of read cycle equals:

$$V_{out} = -\frac{1}{C_{int}} \cdot \int^{T_{int}} i_D(V_{GS}, V_{th}, \mu) \cdot dt$$

Hence, the threshold voltage and the mobility of the drive transistor 220 may be extracted by reading the output voltage 256 of the amplifier 250 in the middle and at the end of the read phase 326.

FIG. 3B is a timing diagram for the reading process of the threshold turn-on voltage parameter of the OLED 222 in FIG. 2. The reading process of the OLED 222 also includes four phases, a reset phase 340, an integration phase 342, a pre-charge phase 344 and a read phase 346. Just like the reading process for the drive transistor 220 in FIG. 3A, the reading process for OLED starts by activating the select input 230 with a high select signal 302. The timing of the signals 304, 306, 308, and 310 ($\phi_1$, $\phi_2$, $\phi_3$, $\phi_4$) to the switches 260, 262, 264 and 254 is the same as the read process for the drive transistor 220 in FIG. 3A. A programming signal 332 for the programming input 232, a signal 334 for the node 244 and an output signal 336 for the output of the amplifier 250 are different from the signals in FIG. 3A.

During the reset phase 340, a high enough voltage level 332 ($V_{RST\_OLED}$) is applied to the programming data input 232 ($V_{Data}$) to maximize the current flow through the drive transistor 220. Consequently, the voltage at the node 244 in FIG. 2 is discharged to ground through the switch 260 to get ready for the next cycle.

During the integration phase 342, the signal 306 ($\phi_2$) to the switch 262 stays high which provides a charging path from the voltage source 210 through the switch 262. The programming voltage input 232 ($V_{Data}$) is set to a voltage level 332

($V_{INT\_OLED}$) such that once the capacitor 240 ($C_{oled}$) is fully charged, the voltage at the node 244 is greater than the turn-on voltage of the OLED 222. In this case, by the end of the integration phase 342, the drive transistor 220 is driving a constant current through the OLED 222.

During the pre-charge phase 344, the drive transistor 220 is turned off by the signal 332 to the programming input 232. The capacitor 240 ($C_{oled}$) is allowed to discharge until it reaches the turn-on voltage of OLED 222 by the end of the pre-charge phase 344.

During the read phase 346, a high enough voltage 332 ($V_{RD\_OLED}$) is applied to the programming voltage input 232 ($V_{Data}$) to minimize the channel resistance of the drive transistor 220. If the pre-charge phase is long enough, the settled voltage across the capacitor 252 ($C_{int}$) will not be a function of pre-charge time. Consequently, the output voltage 256 of the charge-pump amplifier 250 at the end of the read phase is given by:

$$V_{out} = -\frac{C_{oled}}{C_{int}} \cdot V_{ON,oled}$$

The signal 308 ($\phi_3$) to the switch 264 is kept high to provide a charge transfer path from the drive circuit 202 to the charge-pump amplifier 250. Thus the output voltage signal 336 may be used to determine the turn-on voltage of the OLED 220.

FIG. 3C is a timing diagram for the direct reading of the drive transistor 220 using the extraction circuit 200 in FIG. 2. The direct reading process has a reset phase 350, a pre-charge phase 352 and an integrate/read phase 354. The readout process is initiated by activating the select input 230 in FIG. 2. The select signal 302 to the select input 230 is kept high throughout the readout process as shown in FIG. 3C. The signals 364 and 366 ($\phi_1$, $\phi_2$) for the switches 260 and 262 are inactive in this readout process.

During the reset phase 350, the signals 368 and 370 ($\phi_3$, $\phi_4$) for the switches 264 and 254 are set high in order to provide a discharge path to virtual ground. A high enough voltage 372 ($V_{RST\_TFT}$) is applied to the programming input 232 ($V_{Data}$) to maximize the current flow through the drive transistor 220. Consequently, the node 244 is discharged to the common-mode voltage 374 ($VCM_{RST}$) to get ready for the next cycle.

During the pre-charge phase 354, the drive transistor 220 is turned off by applying an off voltage 372 ($V_{OFF}$) to the programming input 232 in FIG. 2. The common-mode voltage input 258 to the positive input of the amplifier 250 is raised to $VCM_{RD}$ in order to precharge the line capacitance. At the end of the pre-charge phase 354, the signal 370 ($\phi_4$) to the switch 254 is turned off to prepare the charge-pump amplifier 250 for the next cycle.

At the beginning of the read/integrate phase 356, the programming voltage input 232 ($V_{Data}$) is raised to $V_{INT\_TFT}$ 372 to turn the drive transistor 220 on. The capacitor 240 ($C_{OLED}$) starts to accumulate the charge until $V_{Data}$ minus the voltage at the node 244 is equal to the threshold voltage of the drive transistor 220. In the meantime, a proportional charge is accumulated in the capacitor 252 ($C_{INT}$). Accordingly, at the end of the read cycle 356, the output voltage 376 at the output 256 of the amplifier 250 is a function of the threshold voltage which is given by:

$$V_{out} = \frac{C_{oled}}{C_{int}} \cdot (V_{Data} - V_{th})$$

As indicated by the above equation, in the case of the direct reading, the output voltage has a positive polarity. Thus, the threshold voltage of the drive transistor 220 may be determined by the output voltage of the amplifier 250.

As explained above, the drive transistor 220 in FIG. 2 may be a p-type transistor. FIG. 4A-4C are signal timing diagrams of the signals applied to the components in FIG. 2 to extract voltage threshold and mobility from the drive transistor 220 and the OLED 222 when the drive transistor 220 is a p-type transistor. In the example where the drive transistor 220 is a p-type transistor, the source of the drive transistor 220 is coupled to the supply line 212 (VD) and the drain of the drive transistor 220 is coupled to the OLED 222. FIG. 4A is a timing diagram showing the signals applied to the extraction circuit 200 to extract the threshold voltage and mobility from the drive transistor 220 when the drive transistor 220 is a p-type transistor. FIG. 4A shows voltage signals 402-416 for the select input 232, the switches 260, 262, 264 and 254, the programming data input 230, the voltage at the node 244 and the output voltage 256 in FIG. 2. The data extraction is performed in three phases, a reset phase 420, an integrate/pre-charge phase 422, and a read phase 424.

As shown in FIG. 4A, the select signal 402 is active low and kept low throughout the readout phases 420, 422 and 424. Throughout the readout process, the signals 404 and 406 ($\phi_1$, $\phi_2$) to the switches 260 and 262 are kept low (inactive). During the reset phase, the signals 408 and 410 ($\phi_3$, $\phi_4$) at the switches 264 and 254 are set to high in order to charge the node 244 to a reset common mode voltage level $VCM_{rst}$. The common-mode voltage input 258 on the charge-pump input 258 ($V_{rst}$) should be low enough to keep the OLED 222 off. The programming data input 232 $V_{Data}$ is set to a low enough value 412 ($V_{RST\_TFT}$) to provide maximum charging current through the driver transistor 220.

During the integrate/pre-charge phase 422, the common-mode voltage on the common voltage input 258 is reduced to $VCM_{int}$ and the programming input 232 ($V_{Data}$) is increased to a level 412 ($V_{INT\_TFT}$) such that the drive transistor 220 will conduct in the reverse direction. If the allocated time for this phase is long enough, the voltage at the node 244 will decline until the gate to source voltage of the drive transistor 220 reaches the threshold voltage of the drive transistor 220. Before the end of this cycle, the signal 410 ($\phi_4$) to the switch 254 goes low in order to prepare the charge-pump amplifier 250 for the read phase 424.

The read phase 424 is initiated by decreasing the signal 412 at the programming input 232 ($V_{Data}$) to $V_{RD\_TFT}$ so as to turn the drive transistor 220 on. The charge stored on the capacitor 240 ($C_{OLED}$) is now transferred to the capacitor 254 ($C_{INT}$). At the end of the read phase 424, the signal 408 ($\phi_3$) to the switch 264 is set to low in order to isolate the charge-pump amplifier 250 from the drive circuit 202. The output voltage signal 416 $V_{out}$ from the amplifier output 256 is now a function of the threshold voltage of the drive transistor 220 given by:

$$V_{out} = -\frac{C_{oled}}{C_{int}}(V_{INT\_TFT} - V_{th})$$

FIG. 4B is a timing diagram for the in-pixel extraction of the threshold voltage of the OLED 222 in FIG. 2 assuming that the drive transistor 220 is a p-type transistor. The extraction process is very similar to the timing of signals to the extraction circuit 200 for an n-type drive transistor in FIG. 3A. FIG. 4B shows voltage signals 432-446 for the select input 230, the switches 260, 262, 264 and 254, the programming data input 232, the voltage at the node 244 and the amplifier output 256 in FIG. 2. The extraction process includes a reset phase 450, an integration phase 452, a pre-charge phase 454 and a read phase 456. The major difference in this readout cycle in comparison to the readout cycle in FIG. 4A is the voltage levels of the signal 442 to the programming data input 232 ($V_{Data}$) that are applied to the driver circuit 210 in each readout phase. For a p-type thin film transistor that may be used for the drive transistor 220, the select signal 430 to the select input 232 is active low. The select input 232 is kept low throughout the readout process as shown in FIG. 4B.

The readout process starts by first resetting the capacitor 240 ($C_{OLED}$) in the reset phase 450. The signal 434 ($\phi_1$) to the switch 260 is set high to provide a discharge path to ground. The signal 442 to the programming input 232 ($V_{Data}$) is lowered to $V_{RST\_OLED}$ in order to turn the drive transistor 220 on.

In the integrate phase 452, the signals 434 and 436 ($\phi_1$, $\phi_2$) to the switches 260 and 262 are set to off and on states respectively, to provide a charging path to the OLED 222. The capacitor 240 ($C_{OLED}$) is allowed to charge until the voltage 444 at node 244 goes beyond the threshold voltage of the OLED 222 to turn it on. Before the end of the integration phase 452, the voltage signal 442 to the programming input 232 ($V_{Data}$) is raised to $V_{OFF}$ to turn the drive transistor 220 off.

During the pre-charge phase 454, the accumulated charge on the capacitor 240 ($C_{OLED}$) is discharged into the OLED 222 until the voltage 444 at the node 244 reaches the threshold voltage of the OLED 222. Also, in the pre-charge phase 454, the signals 434 and 436 ($\phi_1$, $\phi_2$) to the switches 260 and 262 are turned off while the signals 438 and 440 ($\phi_3$, $\phi_4$) to the switches 264 and 254 are set on. This provides the condition for the amplifier 250 to precharge the supply line 212 (VD) to the common mode voltage input 258 (VCM) provided at the positive input of the amplifier 250. At the end of the pre-charge phase, the signal 430 ($\phi_4$) to the switch 254 is turned off to prepare the charge-pump amplifier 250 for the read phase 456.

The read phase 456 is initiated by turning the drive transistor 220 on when the voltage 442 to the programming input 232 ($V_{Data}$) is lowered to $V_{RD\_OLED}$. The charge stored on the capacitor 240 ($C_{OLED}$) is now transferred to the capacitor 254 ($C_{INT}$) which builds up the output voltage 446 at the output 256 of the amplifier 250 as a function of the threshold voltage of the OLED 220.

FIG. 4C is a signal timing diagram for the direct extraction of the threshold voltage of the drive transistor 220 in the extraction system 200 in FIG. 2 when the drive transistor 220 is a p-type transistor. FIG. 4C shows voltage signals 462-476 for the select input 230, the switches 260, 262, 264 and 254, the programming data input 232, the voltage at the node 244 and the output voltage 256 in FIG. 2. The extraction process includes a pre-charge phase 480 and an integration phase 482. However, in the timing diagram in FIG. 4C, a dedicated final read phase 484 is illustrated which may be eliminated if the output of charge-pump amplifier 250 is sampled at the end of the integrate phase 482.

The extraction process is initiated by simultaneous precharging of the drain storage capacitor 224, the source storage capacitor 226, the capacitor 240 ($C_{OLED}$) and the capacitor 242 in FIG. 2. For this purpose, the signals 462, 468 and 470 to the select line input 230 and the switches 264 and 254 are activated as shown in FIG. 4C. Throughout the readout process, the signals 404 and 406 ($\phi_1$, $\phi_2$) to the switches 260 and 262 are kept low. The voltage level of common mode voltage input 258 (VCM) determines the voltage on the supply line 212 and hence the voltage at the node 244. The common mode voltage (VCM) should be low enough such that the OLED 222 does not turn on. The voltage 472 to the programming input 232 ($V_{Data}$) is set to a level ($V_{RST\_TFT}$) low enough to turn the transistor 220 on.

At the beginning of the integrate phase 482, the signal 470 ($\phi_4$) to the switch 254 is turned off in order to allow the charge-pump amplifier 250 to integrate the current through the drive transistor 220. The output voltage 256 of the charge-pump amplifier 250 will incline at a constant rate which is a function of the threshold voltage of the drive transistor 220 and its gate-to-source voltage. Before the end of the integrate phase 482, the signal 468 ($\phi_3$) to the switch 264 is turned off to isolate the charge-pump amplifier 250 from the driver circuit 220. Accordingly, the output voltage 256 of the amplifier 250 is given by:

$$V_{out} = I_{TFT} \cdot \frac{T_{int}}{C_{int}}$$

where $I_{TFT}$ is the drain current of the drive transistor 220 which is a function of the mobility and ($V_{CM}-V_{Data}-|V_{th}|$). $T_{int}$ is the length of the integration time. In the optional read phase 484, the signal 468 ($\phi_3$) to the switch 264 is kept low to isolate the charge-pump amplifier 250 from the driver circuit 202. The output voltage 256, which is a function of the mobility and threshold voltage of the drive transistor 220, may be sampled any time during the read phase 484.

FIG. 4D is a timing diagram for the direct reading of the OLED 222 in FIG. 2. When the drive transistor 220 is turned on with a high enough gate-to-source voltage it may be utilized as an analog switch to access the anode terminal of the OLED 222. In this case, the voltage at the node 244 is essentially equal to the voltage on the supply line 212 (VD). Accordingly, the drive current through the drive transistor 220 will only be a function of the turn-on voltage of the OLED 222 and the voltage that is set on the supply line 212. The drive current may be provided by the charge-pump amplifier 250. When integrated over a certain time period, the output voltage 256 of the integrator circuit 206 is a measure of how much the OLED 222 has aged.

FIG. 4D is a timing diagram showing the signals applied to the extraction circuit 200 to extract the turn-on voltage from the OLED 222 via a direct read. FIG. 4D shows the three phases of the readout process, a pre-charge phase 486, an integrate phase 487 and a read phase 488. FIG. 4D includes a signal 489n or 489p for the select input 230 in FIG. 2, a signal 490 ($\phi_1$) to the switch 260, a signal 491 ($\phi_2$) for the switch 262, a signal 492 ($\phi_3$) for the switch 264, a signal 493 ($\phi_4$) for the switch 254, a programming voltage signal 494n or 494p for the programming data input 232 in FIG. 2, a voltage 495 of the node 244 in FIG. 2 and an output voltage signal 496 for the output 256 of the amplifier 250 in FIG. 2.

The process starts by activating the select signal corresponding to the desired row of pixels in array 102. As illustrated in FIG. 4D, the select signal 489n is active high for an n-type select transistor and active low for a p-type select transistor. A high select signal 489n is applied to the select input 230 in the case of an n-type drive transistor. A low signal 489p is applied to the select input 230 in the case of a p-type drive transistor for the drive transistor 220.

The select signal 489n or 489p will be kept active during the pre-charge and integrate cycles 486 and 487. The $\phi_1$ and $\phi_2$ inputs 490 and 491 are inactive in this readout method. During the pre-charge cycle, the switch signals 492 $\phi_3$ and 493 $\phi_4$ are set high in order to provide a signal path such that the parasitic capacitance 242 of the supply line ($C_p$) and the voltage at the node 244 are pre-charged to the common-mode voltage ($VCM_{OLED}$) provided to the non-inverting terminal of the amplifier 250. A high enough drive voltage signal 494n or 494p ($V_{ON\_nTFT}$ or $V_{ON\_pTFT}$) is applied to the data input 232 ($V_{Data}$) to operate the drive transistor 220 as an analog switch. Consequently, the supply voltage 212 VD and the node 244 are pre-charged to the common-mode voltage ($VCM_{OLED}$) to get ready for the next cycle. At the beginning of the integrate phase 487, the switch input 493 $\phi_4$ is turned off in order to allow the charge-pump module 206 to integrate the current of the OLED 222. The output voltage 496 of the charge-pump module 206 will incline at a constant rate which is a function of the turn-on voltage of the OLED 222 and the voltage 495 set on the node 244, i.e. $VCM_{OLED}$. Before the end of the integrate phase 487, the switch signal 492 $\phi_3$ is turned off to isolate the charge-pump module 206 from the pixel circuit 202. From this instant beyond, the output voltage is constant until the charge-pump module 206 is reset for another reading. When integrated over a certain time period, the output voltage of the integrator is given by:

$$V_{out} = I_{OLED} \frac{T_{int}}{C_{int}}$$

which is a measure of how much the OLED has aged. $T_{int}$ in this equation is the time interval between the falling edge of the switch signal 493 ($\phi_4$) to the falling edge of the switch signal 492 ($\phi_3$).

Figure 5:
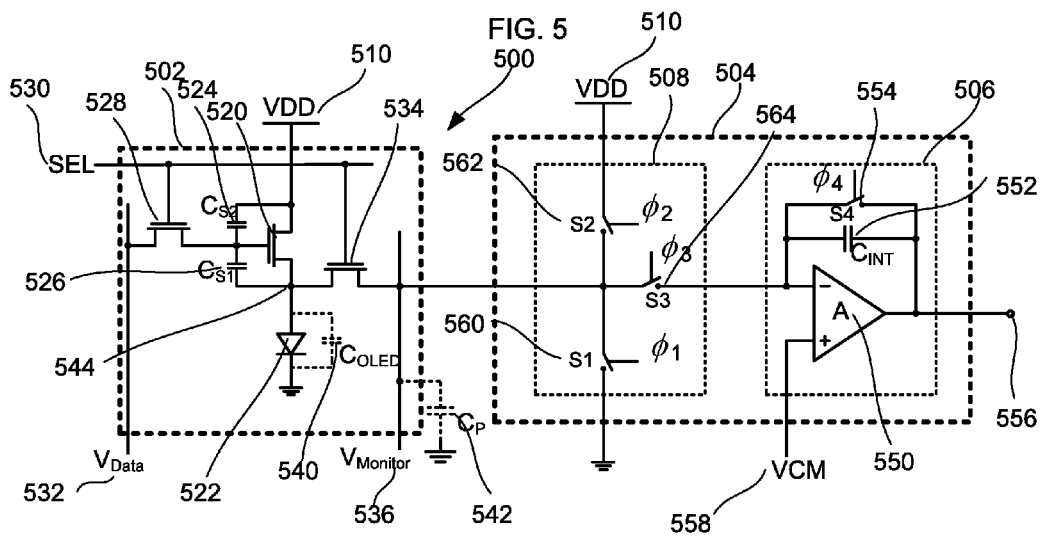
FIG. 5 is a circuit diagram of a data extraction circuit for a three-transistor drive circuit for a pixel in the AMOLED display in FIG. 1 for extraction of parameters.

Similar extraction processes of a two transistor type driver circuit such as that in FIG. 2 may be utilized to extract non-uniformity and aging parameters such as threshold voltages and mobility of a three transistor type driver circuit as part of the data extraction system 500 as shown in FIG. 5. The data extraction system 500 includes a drive circuit 502 and a readout circuit 504. The readout circuit 504 is part of the current supply and readout circuit 120 and gathers data from a column of pixels 104 as shown in FIG. 1 and includes a charge pump circuit 506 and a switch-box circuit 508. A voltage source 510 provides the supply voltage (VDD) to the drive circuit 502. The charge-pump and switch-box circuits 506 and 508 are implemented on the top or bottom side of the array 102 such as in the voltage drive 114 and the current supply and readout circuit 120 in FIG. 1. This is achieved by either direct fabrication on the same substrate as for the array 102 or by bonding a microchip on the substrate or a flex as a hybrid solution.

The drive circuit 502 includes a drive transistor 520, an organic light emitting device 522, a drain storage capacitor 524, a source storage capacitor 526 and a select transistor 528. A select line input 530 is coupled to the gate of the select transistor 528. A programming input 532 is coupled through the select transistor 528 to the gate of the drive transistor 220. The select line input 530 is also coupled to the gate of an output transistor 534. The output transistor 534 is coupled to the source of the drive transistor 520 and a voltage monitoring output line 536. The drain of the drive transistor 520 is coupled to the supply voltage source 510 and the source of the drive transistor 520 is coupled to the OLED 522. The source storage capacitor 526 is coupled between the gate and the source of the drive transistor 520. The drain storage capacitor 524 is coupled between the gate and the drain of the drive transistor 520. The OLED 522 has a parasitic capacitance that is modeled as a capacitor 540. The monitor output voltage line 536 also has a parasitic capacitance that is modeled as a capacitor 542. The drive transistor 520 in this example is a thin film transistor that is fabricated from amorphous silicon. A voltage node 544 is the point between the source terminal of the drive transistor 520 and the OLED 522. In this example, the drive transistor 520 is an n-type transistor. The system 500 may be implemented with a p-type drive transistor in place of the drive transistor 520.

The readout circuit 504 includes the charge-pump circuit 506 and the switch-box circuit 508. The charge-pump circuit 506 includes an amplifier 550 which has a capacitor 552 ($C_{int}$) in a negative feedback loop. A switch 554 (S4) is utilized to discharge the capacitor 552 $C_{int}$ during the pre-charge phase. The amplifier 550 has a negative input coupled to the capacitor 552 and the switch 554 and a positive input coupled to a common mode voltage input 558 (VCM). The amplifier 550 has an output 556 that is indicative of various extracted factors of the drive transistor 520 and OLED 522 as will be explained below.

The switch-box circuit 508 includes several switches 560, 562 and 564 to direct the current to and from the drive circuit 502. The switch 560 is used during the reset phase to provide the discharge path to ground. The switch 562 provides the supply connection during normal operation of the pixel 104 and also during the integration phase of the readout process. The switch 564 is used to isolate the charge-pump circuit 506 from the supply line voltage source 510.

In the three transistor drive circuit 502, the readout is normally performed through the monitor line 536. The readout can also be taken through the voltage supply line from the supply voltage source 510 similar to the process of timing signals in FIG. 3A-3C. Accurate timing of the input signals ($\phi_1$-$\phi_4$) to the switches 560, 562, 564 and 554, the select input 530 and the programming voltage input 532 ($V_{Data}$) is used to control the performance of the readout circuit 500. Certain voltage levels are applied to the programming data input 532 ($V_{Data}$) and the common mode voltage input 558 (VCM) during each phase of readout process.

The three transistor drive circuit 502 may be programmed differentially through the programming voltage input 532 and the monitoring output 536. Accordingly, the reset and pre-charge phases may be merged together to form a reset/pre-charge phase and which is followed by an integrate phase and a read phase.

Figure 6A:
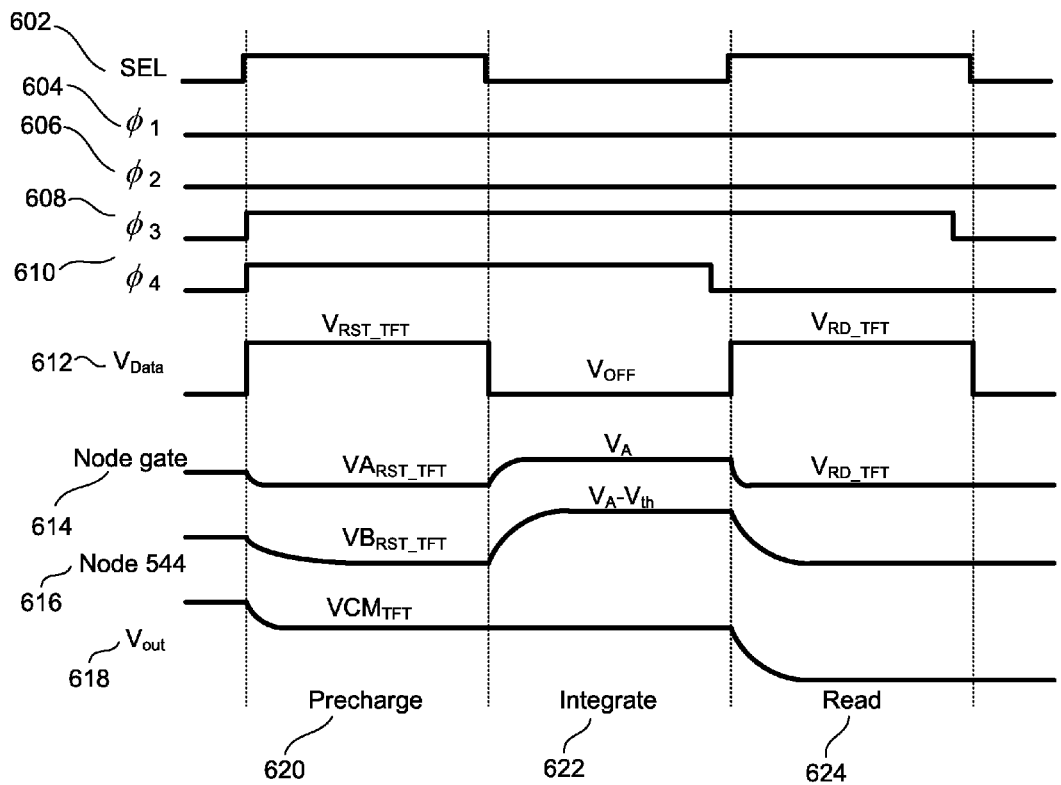
FIG. 6A is a signal timing diagram of the signals to the data extraction circuit to extract the threshold voltage and mobility of the drive transistor in FIG. 5.

FIG. 6A is a timing diagram of the signals involving the extraction of the threshold voltage and mobility of the drive transistor 520 in FIG. 5. The timing diagram includes voltage signals 602-618 for the select input 530, the switches 560, 562, 564 and 554, the programming voltage input 532, the voltage at the gate of the drive transistor 520, the voltage at the node 544 and the output voltage 556 in FIG. 5. The readout process in FIG. 6A has a pre-charge phase 620, an integrate phase 622 and a read phase 624. The readout process initiates by simultaneous precharging of the drain capacitor 524, the source capacitor 526, and the parasitic capacitors 540 and 542. For this purpose, the select line voltage 602 and the signals 608 and 610 ($\phi_3$, $\phi_4$) to the switches 564 and 554 are activated as shown in FIG. 6A. The signals 604 and 606 ($\phi_1$, $\phi_2$) to the switches 560 and 562 remain low throughout the readout cycle.

The voltage level of the common mode input 558 (VCM) determines the voltage on the output monitor line 536 and hence the voltage at the node 544. The voltage to the common mode input 558 ($VCM_{TFT}$) should be low enough such that the OLED 522 does not turn on. In the pre-charge phase 620, the voltage signal 612 to the programming voltage input 532 ($V_{Data}$) is high enough ($V_{RST\_TFT}$) to turn the drive transistor 520 on, and also low enough such that the OLED 522 always stays off.

At the beginning of the integrate phase 622, the voltage 602 to the select input 530 is deactivated to allow a charge to be stored on the capacitor 540 ($C_{OLED}$). The voltage at the node 544 will start to rise and the gate voltage of the drive transistor 520 will follow that with a ratio of the capacitance value of the source capacitor 526 over the capacitance of the source capacitor 526 and the drain capacitor 524 [$C_{S1}/(C_{S1}+C_{S2})$]. The charging will complete once the difference between the gate voltage of the drive transistor 520 and the voltage at node 544 is equal to the threshold voltage of the drive transistor 520. Before the end of the integration phase 622, the signal 610 ($\phi_4$) to the switch 554 is turned off to prepare the charge-pump amplifier 550 for the read phase 624.

For the read phase 624, the signal 602 to the select input 530 is activated once more. The voltage signal 612 on the programming input 532 ($V_{RD\_TFT}$) is low enough to keep the drive transistor 520 off. The charge stored on the capacitor 240 ($C_{OLED}$) is now transferred to the capacitor 254 ($C_{INT}$) and creates an output voltage 618 proportional to the threshold voltage of the drive transistor 520:

$$V_{out} = -\frac{C_{oled}}{C_{int}}(V_G - V_{th})$$

Before the end of the read phase 624, the signal 608 ($\phi_3$) to the switch 564 turns off to isolate the charge-pump circuit 506 from the drive circuit 502.

Figure 6B:
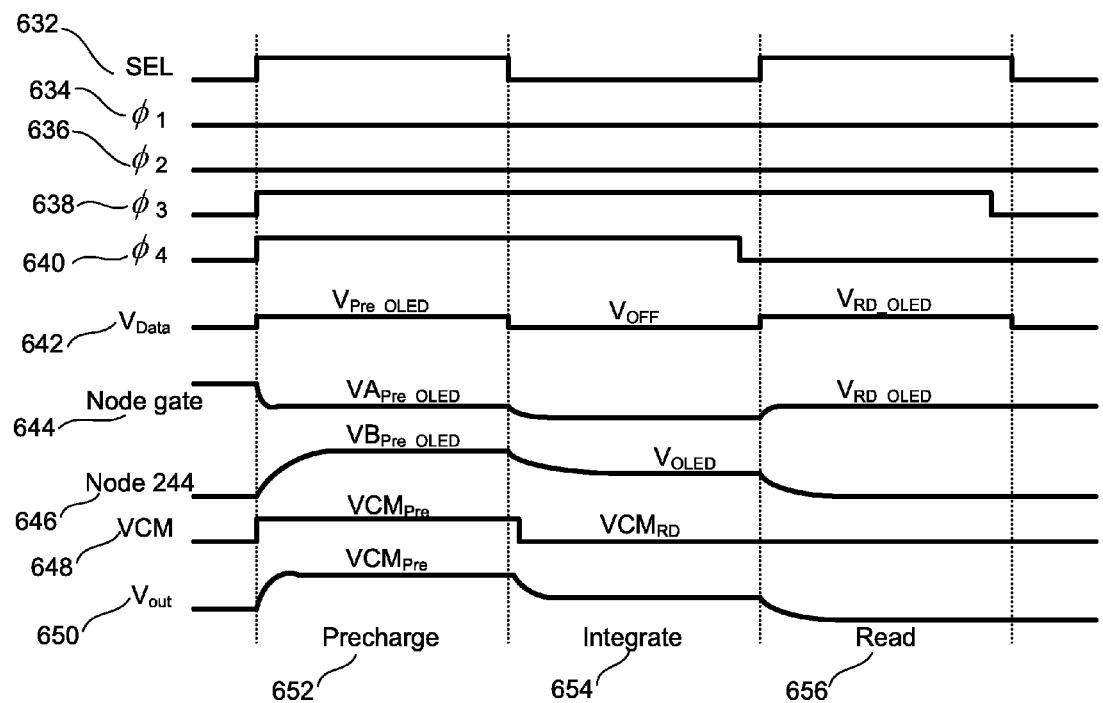
FIG. 6B is a signal timing diagram of the signals to the data extraction circuit to extract the characteristic voltage of the OLED in FIG. 5.

FIG. 6B is a timing diagram for the input signals for extraction of the turn-on voltage of the OLED 522 in FIG. 5. FIG. 6B includes voltage signals 632-650 for the select input 530, the switches 560, 562, 564 and 554, the programming voltage input 532, the voltage at the gate of the drive transistor 520, the voltage at the node 544, the common mode voltage input 558, and the output voltage 556 in FIG. 5. The readout process in FIG. 6B has a pre-charge phase 652, an integrate phase 654 and a read phase 656. Similar to the readout for the drive transistor 220 in FIG. 6A, the readout process starts with simultaneous precharging of the drain capacitor 524, the source capacitor 526, and the parasitic capacitors 540 and 542 in the pre-charge phase 652. For this purpose, the signal 632 to the select input 530 and the signals 638 and 640 ($\phi_3$, $\phi_4$) to the switches 564 and 554 are activated as shown in FIG. 6B. The signals 634 and 636 ($\phi_1$, $\phi_2$) remain low throughout the readout cycle. The input voltage 648 ($VCM_{Pre}$) to the common mode voltage input 258 should be high enough such that the OLED 522 is turned on. The voltage 642 ($V_{Pre\_OLED}$) to the programming input 532 ($V_{Data}$) is low enough to keep the drive transistor 520 off.

At the beginning of the integrate phase 654, the signal 632 to the select input 530 is deactivated to allow a charge to be stored on the capacitor 540 ($C_{OLED}$). The voltage at the node 544 will start to fall and the gate voltage of the drive transistor 520 will follow with a ratio of the capacitance value of the source capacitor 526 over the capacitance of the source capacitor 526 and the drain capacitor 524 [$C_{S1}/(C_{S1}+C_{S2})$]. The discharging will complete once the voltage at node 544 reaches the ON voltage ($V_{OLED}$) of the OLED 522. Before the end of the integration phase 654, the signal 640 ($\phi_4$) to the switch 554 is turned off to prepare the charge-pump circuit 506 for the read phase 656.

For the read phase 656, the signal 632 to the select input 530 is activated once more. The voltage 642 on the ($V_{RD\_OLED}$) programming input 532 should be low enough to keep the drive transistor 520 off. The charge stored on the capacitor 540 ($C_{OLED}$) is then transferred to the capacitor 552 ($C_{INT}$) creating an output voltage 650 at the amplifier output 556 proportional to the ON voltage of the OLED 522.

$$V_{out} = -\frac{C_{oled}}{C_{int}} \cdot V_{ON,oled}$$

The signal 638 ($\phi_3$) turns off before the end of the read phase 656 to isolate the charge-pump circuit 508 from the drive circuit 502.

Figure 6C:
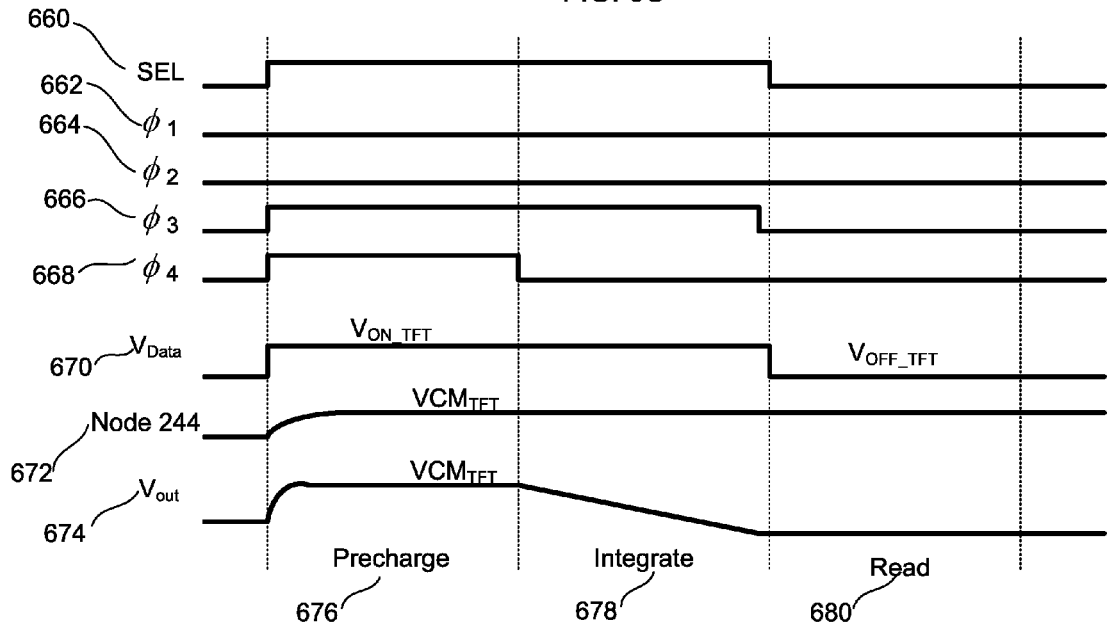
FIG. 6C is a signal timing diagram the signals to the data extraction circuit for a direct read to extract the threshold voltage of the drive transistor in FIG. 5.

As shown, the monitor output transistor 534 provides a direct path for linear integration of the current for the drive transistor 520 or the OLED 522. The readout may be carried out in a pre-charge and integrate cycle. However, FIG. 6C shows timing diagrams for the input signals for an additional final read phase which may be eliminated if the output of charge-pump circuit 508 is sampled at the of the integrate phase. FIG. 6C includes voltage signals 660-674 for the select input 530, the switches 560, 562, 564 and 554, the programming voltage input 532, the voltage at the node 544, and the output voltage 556 in FIG. 5. The readout process in FIG. 6C therefore has a pre-charge phase 676, an integrate phase 678 and an optional read phase 680.

The direct integration readout process of the n-type drive transistor 520 in FIG. 5 as shown in FIG. 6C is initiated by simultaneous precharging of the drain capacitor 524, the source capacitor 526, and the parasitic capacitors 540 and 542. For this purpose, the signal 660 to the select input 530 and the signals 666 and 668 ($\phi_3$, $\phi_4$) to the switches 564 and 554 are activated as shown in FIG. 6C. The signals 662 and 664 ($\phi_1$, $\phi_2$) to the switches 560 and 562 remain low throughout the readout cycle. The voltage level of the common mode voltage input 558 (VCM) determines the voltage on the monitor output line 536 and hence the voltage at the node 544. The voltage signal ($VCM_{TFT}$) of the common mode voltage input 558 is low enough such that the OLED 522 does not turn on. The signal 670 ($V_{ON\_TFT}$) to the programming input 532 ($V_{Data}$) is high enough to turn the drive transistor 520 on.

At the beginning of the integrate phase 678, the signal 668 ($\phi_4$) to the switch 554 is turned off in order to allow the charge-pump amplifier 550 to integrate the current from the drive transistor 520. The output voltage 674 of the charge-pump amplifier 550 declines at a constant rate which is a function of the threshold voltage, mobility and the gate-to-source voltage of the drive transistor 520. Before the end of the integrate phase, the signal 666 ($\phi_3$) to the switch 564 is turned off to isolate the charge-pump circuit 508 from the drive circuit 502. Accordingly, the output voltage is given by:

$$V_{out} = -I_{TFT} \cdot \frac{T_{int}}{C_{int}}$$

where $I_{TFT}$ is the drain current of drive transistor 520 which is a function of the mobility and ($V_{Data}-V_{CM}-V_{th}$). $T_{int}$ is the length of the integration time. The output voltage 674, which is a function of the mobility and threshold voltage of the drive transistor 520, may be sampled any time during the read phase 680.

Figure 6D:
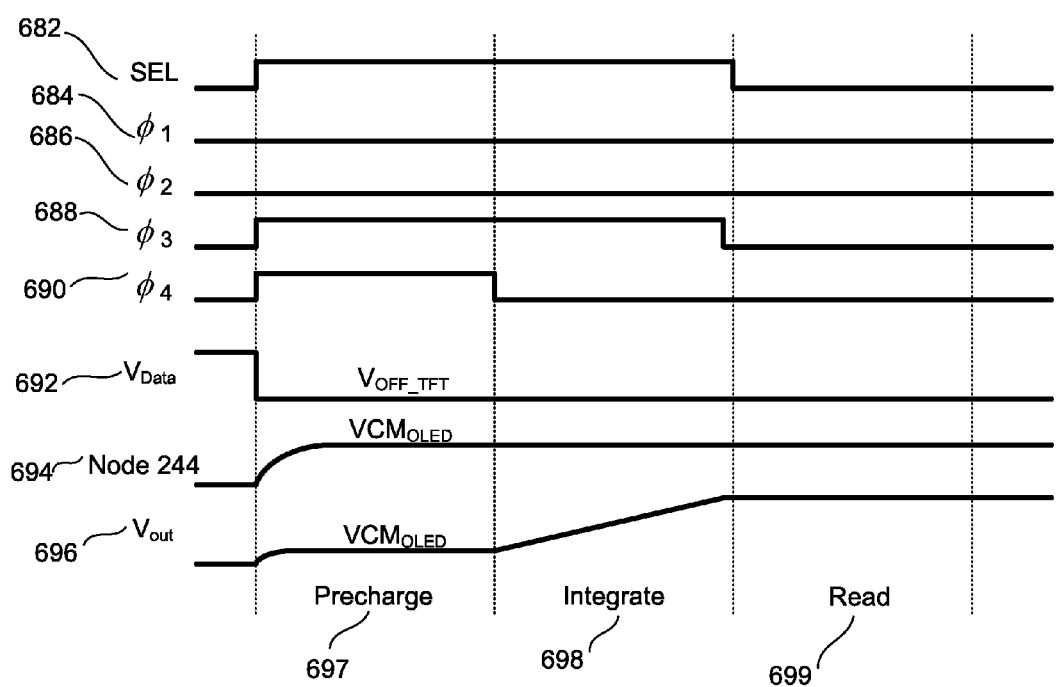
FIG. 6D is a signal timing diagram of the signals to the data extraction circuit for a direct read to extract the characteristic voltage of the OLED in FIG. 5.

FIG. 6D shows a timing diagram of input signals for the direct reading of the on (threshold) voltage of the OLED 522 in FIG. 5. FIG. 6D includes voltage signals 682-696 for the select input 530, the switches 560, 562, 564 and 554, the programming voltage input 532, the voltage at the node 544, and the output voltage 556 in FIG. 5. The readout process in FIG. 6C has a pre-charge phase 697, an integrate phase 698 and an optional read phase 699.

The readout process in FIG. 6D is initiated by simultaneous precharging of the drain capacitor 524, the source capacitor 526, and the parasitic capacitors 540 and 542. For this purpose, the signal 682 to the select input 530 and the signals 688 and 690 ($\phi_3$, $\phi_4$) to the switches 564 and 554 are activated as shown in FIG. 6D. The signals 684 and 686 ($\phi_1$, $\phi_2$) remain low throughout the readout cycle. The voltage level of the common mode voltage input 558 (VCM) determines the voltage on the monitor output line 536 and hence the voltage at the node 544. The voltage signal ($VCM_{OLED}$) of the common mode voltage input 558 is high enough such to turn the OLED 522 on. The signal 692 ($V_{OFF\_TFT}$) of the programming input 532 ($V_{Data}$) is low enough to keep the drive transistor 520 off.

At the beginning of the integrate phase 698, the signal 690 ($\phi_4$) to the switch 552 is turned off in order to allow the charge-pump amplifier 550 to integrate the current from the OLED 522. The output voltage 696 of the charge-pump amplifier 550 will incline at a constant rate which is a function of the threshold voltage and the voltage across the OLED 522.

Before the end of the integrate phase 698, the signal 668 ($\phi_3$) to the switch 564 is turned off to isolate the charge-pump circuit 508 from the drive circuit 502. Accordingly, the output voltage is given by:

$$V_{out} = I_{OLED} \cdot \frac{T_{int}}{C_{int}}$$

where $I_{OLED}$ is the OLED current which is a function of ($V_{CM}-V_{th}$), and $T_{int}$ is the length of the integration time. The output voltage, which is a function of the threshold voltage of the OLED 522, may be sampled any time during the read phase 699.

The controller 112 in FIG. 1 may be conveniently implemented using one or more general purpose computer systems, microprocessors, digital signal processors, micro-controllers, application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein. The controllers may also be implemented on a computer system or systems that extend across any network environment using any suitable interface mechanisms and communications technologies including, for example telecommunications in any suitable form (e.g., voice, modem, and the like), Public Switched Telephone Network (PSTNs), Packet Data Networks (PDNs), the Internet, intranets, a combination thereof, and the like.

Figure 7:
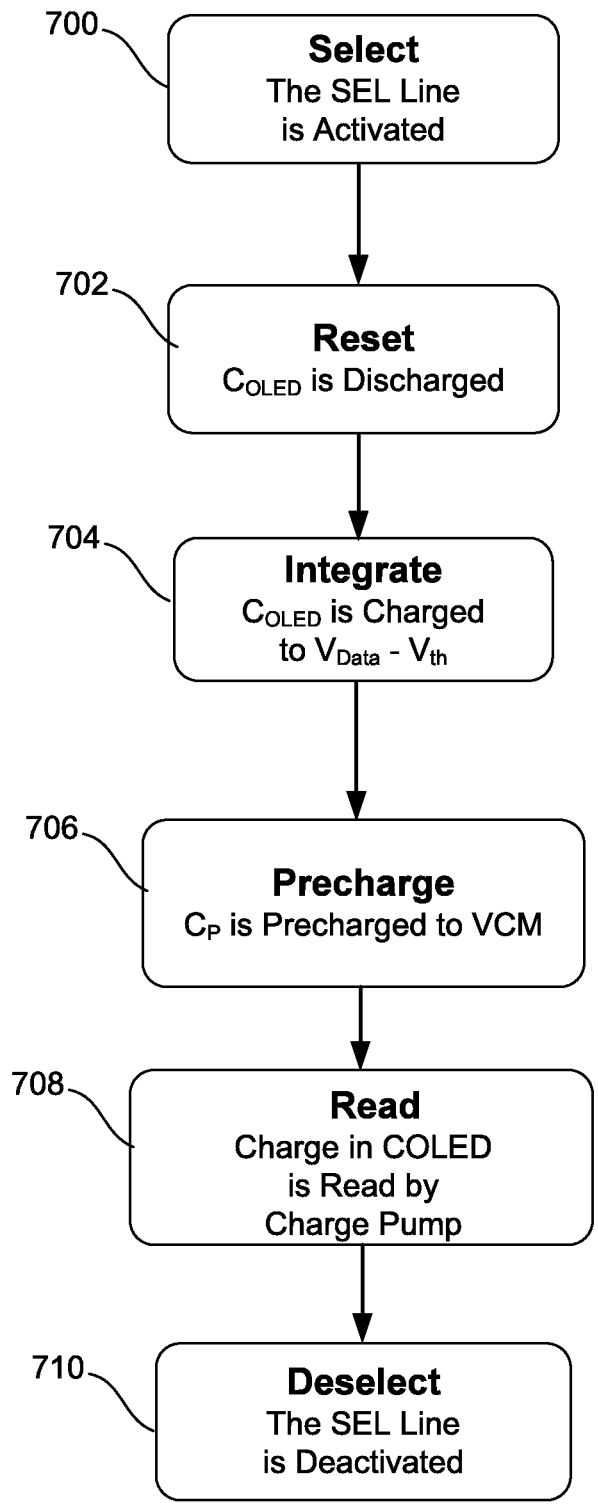
FIG. 7 is a flow diagram of the extraction cycle to readout the characteristics of the drive transistor and the OLED of a pixel circuit in an AMOLED display.

The operation of the example data extraction process, will now be described with reference to the flow diagram shown in FIG. 7. The flow diagram in FIG. 7 is representative of example machine readable instructions for determining the threshold voltages and mobility of a simple driver circuit that allows maximum aperture for a pixel 104 in FIG. 1. In this example, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the extraction sequence could be implemented by software, hardware, and/or firmware. Also, some or all of the machine readable instructions represented by the flowchart of FIG. 7 may be implemented manually. Further, although the example algorithm is described with reference to the flowchart illustrated in FIG. 7, persons of ordinary skill in the art will readily appreciate that many other methods of implementing the example machine readable instructions may alternatively be used. For example, the order of execution of the blocks may be changed, and/or some of the blocks described may be changed, eliminated, or combined.

A pixel 104 under study is selected by turning the corresponding select and programming lines on (700). Once the pixel 104 is selected, the readout is performed in four phases. The readout process begins by first discharging the parasitic capacitance across the OLED ($C_{oled}$) in the reset phase (702). Next, the drive transistor is turned on for a certain amount of time which allows some charge to be accumulated on the capacitance across the OLED $C_{oled}$ (704). In the integrate phase, the select transistor is turned off to isolate the charge on the capacitance across the OLED $C_{oled}$ and then the line parasitic capacitance ($C_P$) is precharged to a known voltage level (706). Finally, the drive transistor is turned on again to allow the charge on the capacitance across the OLED $C_{oled}$ to be transferred to the charge-pump amplifier output in a read phase (708). The amplifier's output represent a quantity which is a function of mobility and threshold voltage. The readout process is completed by deselecting the pixel to prevent interference while other pixels are being calibrated (710).

Figure 8:
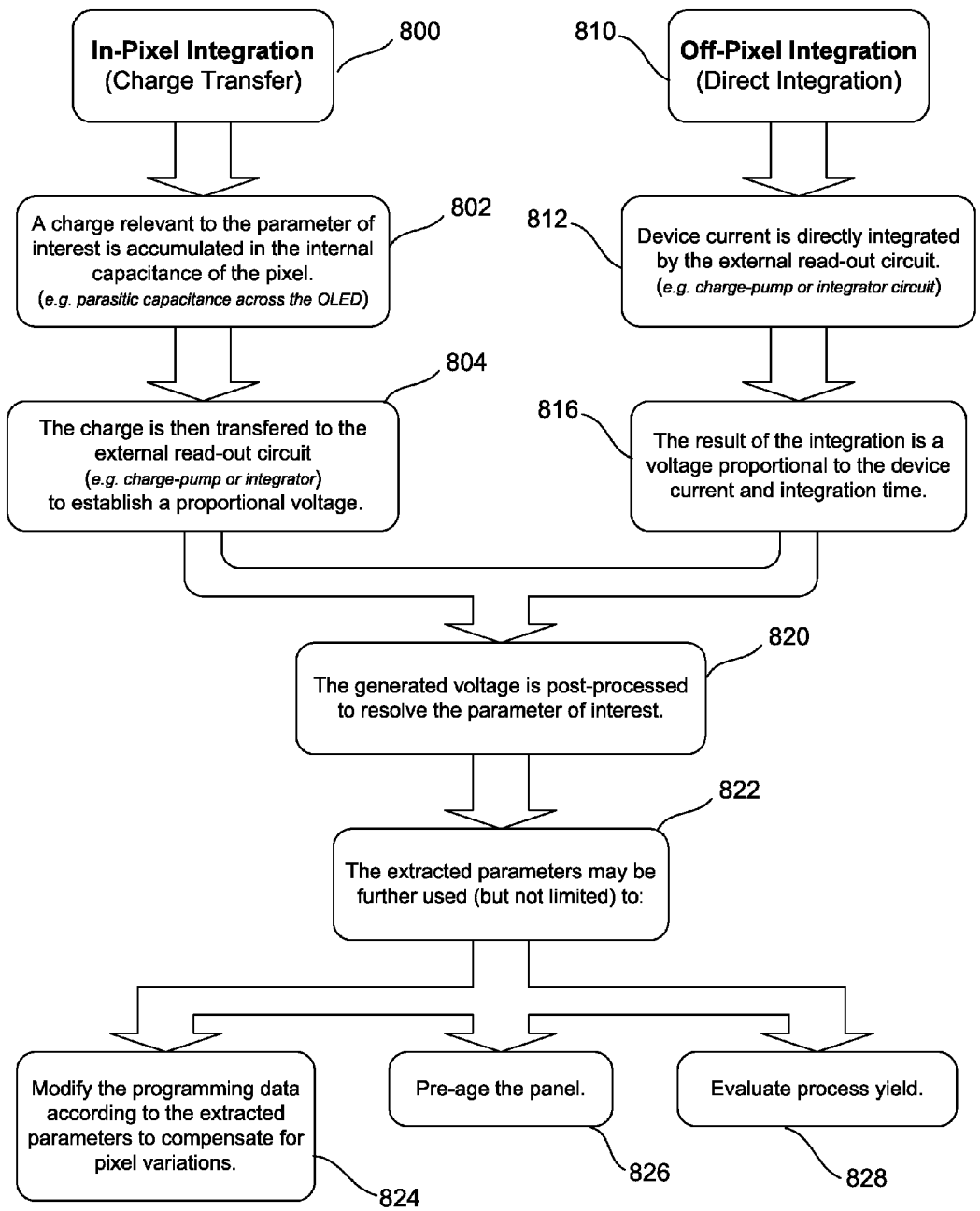
FIG. 8 is a flow diagram of different parameter extraction cycles and final applications.

FIG. 8 is a flow diagram of different extraction cycles and parameter applications for pixel circuits such as the two transistor circuit in FIG. 2 and the three transistor circuit in FIG. 5. One process is an in-pixel integration that involves charge transfer (800). A charge relevant to the parameter of interest is accumulated in the internal capacitance of the pixel (802). The charge is then transferred to the external read-out circuit such as the charge-pump or integrator to establish a proportional voltage (804). Another process is an off-pixel integration or direct integration (810). The device current is directly integrated by the external read-out circuit such as the charge-pump or integrator circuit (812).

In both processes, the generated voltage is post-processed to resolve the parameter of interest such as threshold voltage or mobility of the drive transistor or the turn-on voltage of the OLED (820). The extracted parameters may be then used for various applications (822). Examples of using the parameters include modifying the programming data according to the extracted parameters to compensate for pixel variations (824). Another example is to pre-age the panel of pixels (826). Another example is to evaluate the process yield of the panel of pixels after fabrication (828).

Figure 9:
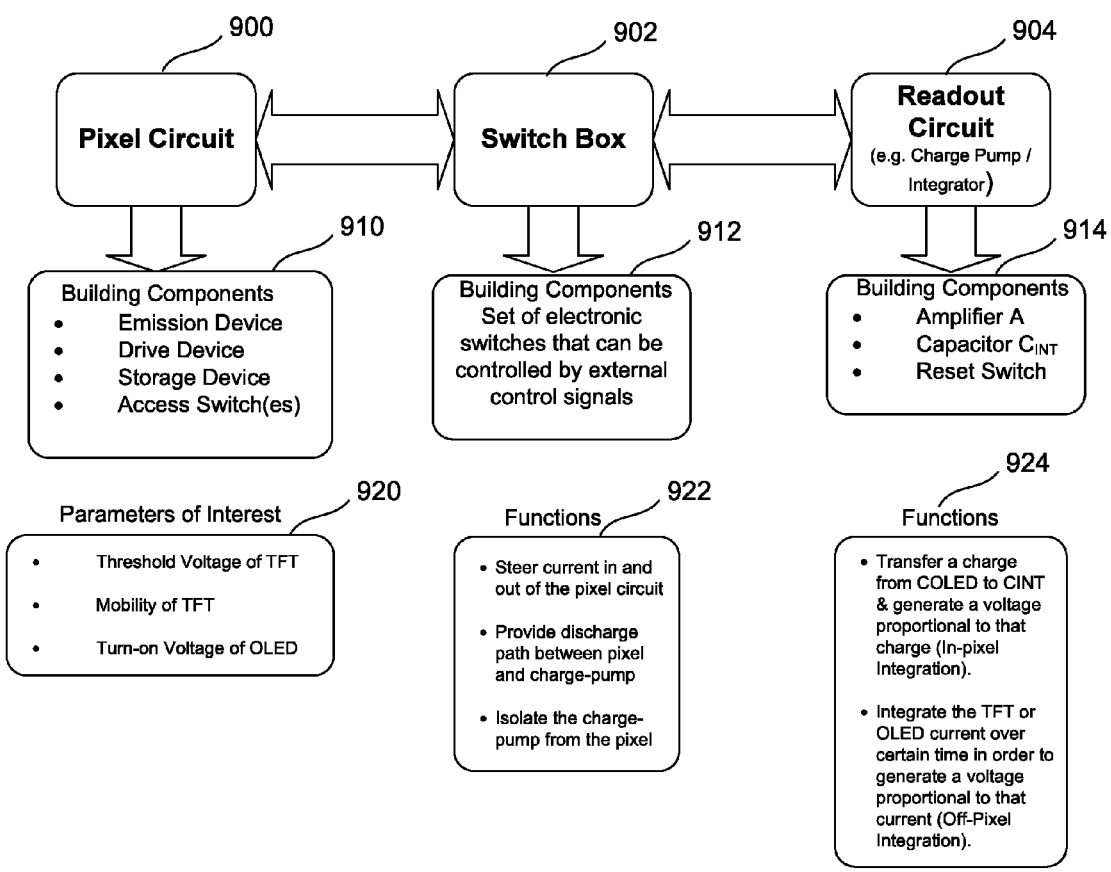
FIG. 9 is a block diagram and chart of the components of a data extraction system.

FIG. 9 is a block diagram and chart of the components of a data extraction system that includes a pixel circuit 900, a switch box 902 and a readout circuit 904 that may be a charge pump/integrator. The building components (910) of the pixel circuit 900 include an emission device such as an OLED, a drive device such as a drive transistor, a storage device such as a capacitor and access switches such as a select switch. The building components 912 of the switch box 902 include a set of electronic switches that may be controlled by external control signals. The building components 914 of the readout circuit 904 include an amplifier, a capacitor and a reset switch.

The parameters of interest may be stored as represented by the box 920. The parameters of interest in this example may include the threshold voltage of the drive transistor, the mobility of the drive transistor and the turn-on voltage of the OLED. The functions of the switch box 902 are represented by the box 922. The functions include steering current in and out of the pixel circuit 900, providing a discharge path between the pixel circuit 900 and the charge-pump of the readout circuit 904 and isolating the charge-pump of the readout circuit 904 from the pixel circuit 900. The functions of the readout circuit 904 are represented by the box 924. One function includes transferring a charge from the internal capacitance of the pixel circuit 900 to the capacitor of the readout circuit 904 to generate a voltage proportional to that charge in the case of in-pixel integration as in steps 800-804 in FIG. 8. Another function includes integrating the current of the drive transistor or the OLED of the pixel circuit 900 over a certain time in order to generate a voltage proportional to the current as in steps 810-814 of FIG. 8.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A data extraction system for an organic light emitting device (OLED) based display, the system comprising:
   a pixel circuit including an organic light emitting device, a drive device to provide a programmable drive current to the light emitting device, a programming input to provide a programming signal, and a storage device to store the programming signal;
   a charge-pump amplifier having a current input and a voltage output, the charge-pump amplifier including an operational amplifier in negative feedback configuration, wherein the feedback is provided by a capacitor connected between the output and the inverting input of the operational amplifier, a common-mode voltage source to drive the non-inverting input of the operational amplifier, and an electronic switch coupled across the capacitor to reset the capacitor;
   a switch module including the input coupled to the output of the pixel circuit and an output coupled to the input of the charge-pump amplifier, the switch module including a plurality of electronic switches to steer current in and out of the pixel circuit, provide a discharge path between the pixel circuit and the charge-pump amplifier, and isolate the charge-pump amplifier from the pixel circuit; and
   a controller coupled to the pixel circuit, charge-pump amplifier and the switch module, the controller controlling input signals to the pixel circuit, charge-pump amplifier and switch module in a predetermined sequence to produce an output voltage value which is a function of a parameter of the pixel circuit, the sequence including providing a program voltage to the programming input to either:
   pre-charge an internal capacitance of the pixel circuit to a charge level and transfer the charge to the charge-pump amplifier via the switch module to generate the output voltage value; or
   provide a current from the pixel circuit to the charge-pump amplifier via the switch module to produce the output voltage value by integration over a certain period of time.

2. The system of claim 1, wherein the drive device is an n-type or p-type transistor manufactured in poly-silicon, amorphous-silicon, metal-oxide, or other suitable material.

3. The system of claim 2 further comprising a select transistor coupled between the programming input and the gate of the drive transistor and wherein a select signal is provided by the controller and coupled to the gate of the select transistor to operate it as an electronic switch.

4. The system of claim 3, wherein the drive device is connected to the input of the switch module through the source or drain terminal of the drive device.

5. The system of claim 3, further comprising a monitor transistor coupled between the input of the switch module and the source or drain terminal of the drive device and wherein the select signal is coupled to the gate to the monitor transistor to operate it as an electronic switch.

6. The system of claim 1, wherein the parameter is the threshold voltage of the drive transistor, an internal capacitance of the pixel is precharged to a level that does not turn the OLED on, the stored charge is allowed to discharge through the switch module and transferred to the charge-pump amplifier until the gate-to-source drive-voltage of the drive transistor is equal to its threshold voltage, and the charge-pump amplifier's output voltage value being a function of the threshold voltage, feedback capacitor, the OLED capacitance, and the programming input voltage.

7. The system of claim 1, wherein the parameter is the mobility of the drive transistor; an internal capacitance of the pixel is precharged to a level that does not turn the OLED on; the stored charge is allowed to partially discharge through the switch module and transferred to the charge-pump amplifier over a shorter integration time; and the charge-pump amplifier's output voltage value is a function of the drive transistor's mobility, integration time, feedback capacitor, and the programming input voltage.

8. The system of claim 1, wherein the parameter is the turn-on voltage of the OLED; the OLED capacitance is precharged to a level higher than the turn-on voltage of the OLED; the charge on the OLED capacitance is then discharged through the OLED until it reaches the turn-on voltage of the OLED; through the switch module, the remaining charge on the OLED capacitance is then transferred to the charge-pump amplifier; and the amplifier output is a value of the turn-on voltage of the OLED as a function of the amplifier's feedback capacitance and the OLED capacitance.

9. The system of claim 1, wherein the parameters are the threshold voltage and mobility of the drive transistor, the program voltage is set to a proper level to turn the drive transistor on, the switch module steers the current of the drive transistor into the charge-pump amplifier to be directly integrated for a certain amount of time, and the amplifier output is a value of the threshold voltage and mobility as a function of the amplifier's feedback capacitor, length of integration time, and the program voltage.

10. The system of claim 1, wherein the parameter is the turn-on voltage of the OLED, the program voltage set to a proper level to operate the drive transistor as a switch, the switch module steers the current of the OLED into the charge-pump amplifier to be directly integrated for a certain amount of time, and the amplifier output is a value of the OLED's turn-on voltage as function of the amplifier's feedback capacitor, length of integration time, and the common-mode voltage set at the non-inverting input of the amplifier.

11. A data extraction system for an organic light emitting device (OLED) based display, the system comprising:
   a pixel circuit including a drive transistor, an organic light emitting device, and a programming input coupled to the gate of the drive transistor, the drive transistor having a source or a drain coupled to the OLED;
   a charge-pump amplifier having an input and an integrated voltage output;
   a switch module including an input coupled to the output of the pixel circuit and an output coupled to the input of the charge-pump amplifier, the switch module including switches to steer current in and out of the pixel circuit, provide a discharge path between the pixel circuit and the charge-pump amplifier and isolate the charge-pump amplifier from the pixel circuit; and
   a controller coupled to the pixel circuit, charge-pump amplifier and the switch module, the controller controlling voltage inputs to the pixel circuit, charge-pump amplifier and switch module in a predetermined sequence to produce an output voltage value which is a function of a parameter of the pixel circuit, the sequence including providing a program voltage to the programming input to either pre-charge a capacitance of the pixel circuit to a charge level, transferring the charge to the charge-pump amplifier via the switch module to generate the output voltage value or providing a current from the pixel circuit to the charge-pump amplifier via the switch module to produce the output voltage value by integration.

12. The system of claim 11, wherein the charge-pump amplifier includes:
   an operational amplifier having a negative input and a positive input coupled to a common mode voltage source;
   a feedback capacitor coupled in a feed-back loop from the negative input to the output of the amplifier; and
   wherein the output of the switch module is coupled to the negative input of the operational amplifier.

13. The system of claim 11 further comprising:
   a select transistor coupled between the programming input and the gate of the drive transistor; and
   an output transistor having a gate coupled between the source or drain of the drive transistor, and a source or drain coupled to the select transistor and a monitor output, the output transistor enabled via a select signal to the drive transistor and the select transistor.

14. The system of claim 11, wherein the drive transistor is an n-type transistor or a p-type transistor.

* * * * *